United States Patent  (10) Patent No.: US 11,812,653 B2
Kim et al.  (45) Date of Patent: Nov. 7, 2023

(54) DISPLAY DEVICE

(71) Applicant: Samsung Display Co., Ltd., Yongin-si (KR)

(72) Inventors: Sun Ho Kim, Yongin-si (KR); Sun Hee Lee, Yongin-si (KR); Gun Hee Kim, Yongin-si (KR); Dong Hwan Shim, Yongin-si (KR); Yoo Min Ko, Yongin-si (KR); Chea Eun Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 304 days.

(21) Appl. No.: 17/361,020

(22) Filed: Jun. 28, 2021

(65) Prior Publication Data
US 2022/0052129 A1  Feb. 17, 2022

(30) Foreign Application Priority Data
Aug. 11, 2020 (KR) .......................... 10-2020-0100770

(51) Int. Cl.
H01L 21/00 (2006.01)
H10K 59/65 (2023.01)
G01S 17/04 (2020.01)
H10K 50/86 (2023.01)
H10K 59/38 (2023.01)
H10K 59/40 (2023.01)
H10K 59/88 (2023.01)
H10K 59/121 (2023.01)
H10K 59/122 (2023.01)
H10K 59/131 (2023.01)
(Continued)

(52) U.S. Cl.
CPC .............. *H10K 59/65* (2023.02); *G01S 17/04* (2020.01); *H10K 50/865* (2023.02); *H10K 59/121* (2023.02); *H10K 59/122* (2023.02); *H10K 59/131* (2023.02); *H10K 59/38* (2023.02); *H10K 59/40* (2023.02); *H10K 59/88* (2023.02); *G06V 40/19* (2022.01); *H04N 23/57* (2023.01)

(58) Field of Classification Search
CPC .............................. H10K 59/131; H10K 59/65
See application file for complete search history.

(56) References Cited

U.S. PATENT DOCUMENTS

2021/0226174 A1  7/2021 Kim et al.
2021/0280663 A1  9/2021 Kim et al.

FOREIGN PATENT DOCUMENTS

KR  10-2021-0093420 A  7/2021
KR  10-2021-0112429 A  9/2021

Primary Examiner — Douglas M Menz
(74) Attorney, Agent, or Firm — Lewis Roca Rothgerber Christie LLP

(57) ABSTRACT

A display device includes: a display panel including a first region including a transmissive part configured to transmit light provided from the outside and a second region not including the transmissive part; and a sensor overlapping with the transmissive part, and configured to obtain electrical information based on information provided from the outside, wherein the display panel includes: a thin film transistor layer including a plurality of transistors; a pixel defining layer defining an emission region of a plurality of pixels; and a light blocking layer on the pixel defining layer, and defining the transmissive part, and wherein the pixel defining layer in the first region covers at least a portion of the thin film transistor layer such that light provided through the transmissive part is blocked.

20 Claims, 17 Drawing Sheets

(51) Int. Cl.
*G06V 40/19* (2022.01)
*H04N 23/57* (2023.01)

DISPLAY DEVICE

CROSS-REFERENCE TO RELATED APPLICATION

The present application claims priority to and the benefit of Korean patent application 10-2020-0100770 filed on Aug. 11, 2020 in the Korean Intellectual Property Office, the entire disclosure of which is incorporated herein by reference.

BACKGROUND

1. Field

Aspects of some example embodiments of the present disclosure generally relate to a display device.

2. Description of the Related Art

As the information society is developed, demand for display devices for displaying images has increased in various forms. For example, display devices have been applied to various electronic devices such as smartphones, digital cameras, notebook computers, navigation systems, and smart televisions.

A display device may include a display panel including a plurality of pixels connected to scan lines, data lines, and power lines so as to display images. Also, display devices may include various sensors, such as a proximity sensor for sensing whether a user is located close to a front surface of the display device, an illuminance sensor for sensing an intensity of illumination of the front surface of the display device, an iris sensor for recognizing an iris of the user, a camera device for photographing a still image and a moving image, and the like.

As display devices are applied to various electronic devices, display devices having various designs are required. For example, in the case of smartphones, a display device in which holes are formed at a front surface of the display device, so that a display region can be enlarged, may be desired. Sensor devices which were located in the holes formed at the front surface of the display device may be arranged to overlap with a display panel.

The above information disclosed in this Background section is only for enhancement of understanding of the background and therefore the information discussed in this Background section does not necessarily constitute prior art.

SUMMARY

Aspects of some example embodiments of the present disclosure generally relate to a display device, and for example, to a display device having a transmission window through which light can be relatively efficiently transmitted.

Aspects of some example embodiments may include a display device having relatively improved external visibility.

Aspects of some example embodiments may also include a display device capable of reducing influence of external light on an internal configuration of the display device.

According to some example embodiments of the present disclosure, a display device includes: a display panel including a first region including a transmissive part configured to transmit light provided from the outside and a second region not including the transmissive part; and a sensor located to overlap with the transmissive part, and obtaining electrical information, based on information applied from the outside, wherein the display panel includes: a thin film transistor layer including a plurality of transistors; a pixel defining layer defining an emission region of a plurality of pixels; and a light blocking layer on the pixel defining layer, the light blocking layer defining the transmissive part, and wherein the pixel defining layer arranged in the first region covers at least a portion of the thin film transistor layer such that light provided through the transmissive part is blocked.

According to some example embodiments, at least a portion of the pixel defining layer arranged in the first region may extend in a thickness direction of the display panel.

According to some example embodiments, the thin film transistor layer may include an insulating layer positioned on the plurality of transistors. The pixel defining layer arranged in the first region may cover a side surface of the insulating layer.

According to some example embodiments, the insulating layer may include a first insulating layer and a second insulating layer. The display panel may further include a transmissive layer between the first insulating layer and the second insulating layer. The transmissive layer may overlap with the transmissive part.

According to some example embodiments, the insulating layer may include a first insulating layer and a second insulating layer positioned on the first insulating layer. In a plan view, the first insulating layer may be positioned in the emission region and the transmissive part, and the second insulating layer may be positioned in the emission region without being in the transmissive part.

According to some example embodiments, the transmissive layer may include siloxane.

According to some example embodiments, the pixel defining layer arranged in the first region may overlap with the transmissive part.

According to some example embodiments, in a plan view, the second region has a shape surrounding the first region.

According to some example embodiments, the display panel may include a detour line electrically connected to a light emitting element in the second region, and the detour line may include a detour path bent at least once not to pass through the first region.

According to some example embodiments, the second region may include a (2-1)th region where the detour line is arranged and a (2-2)th region where the detour line is not arranged.

According to some example embodiments, the display panel may include a dummy line located in the (2-2)th region, the dummy line being electrically disconnected from the detour line.

According to some example embodiments, in a plan view, an arrangement shape of the detour line in the (2-1)th region may correspond to an arrangement shape of the dummy line in the (2-2)th region.

According to some example embodiments, the display panel may further include a disconnection part positioned in the (2-2)th region, and the disconnection part may include an area where a part of the dummy line is disconnected.

According to some example embodiments, the disconnection part may be located under the pixel defining layer. The pixel defining layer may shield the disconnection part from light provided from the transmissive part.

According to some example embodiments, the light blocking layer may shield the disconnection part from light provided from the transmissive part.

According to some example embodiments, the transmissive part may include an area where the light blocking layer in the first region is not located.

According to some example embodiments, the pixel defining layer may include at least one of an opaque metal material including chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), or a carbon-based black pigment.

According to some example embodiments, the display device may further include a plurality of lines through which an electrical signal is applied to a light emitting element. The plurality of lines may include a first line passing through the first region and a second line detouring the first region.

According to some example embodiments, the sensor may be any one of a proximity sensor, an illuminance sensor, an iris sensor, a camera device, an infrared sensor, and an ultrasonic sensor.

According to some example embodiments, the light emitting element may be at least one of an organic light emitting diode, an inorganic light emitting diode, and a light emitting element made of a combination of an organic material and an inorganic material.

BRIEF DESCRIPTION OF THE DRAWINGS

Aspects of some example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
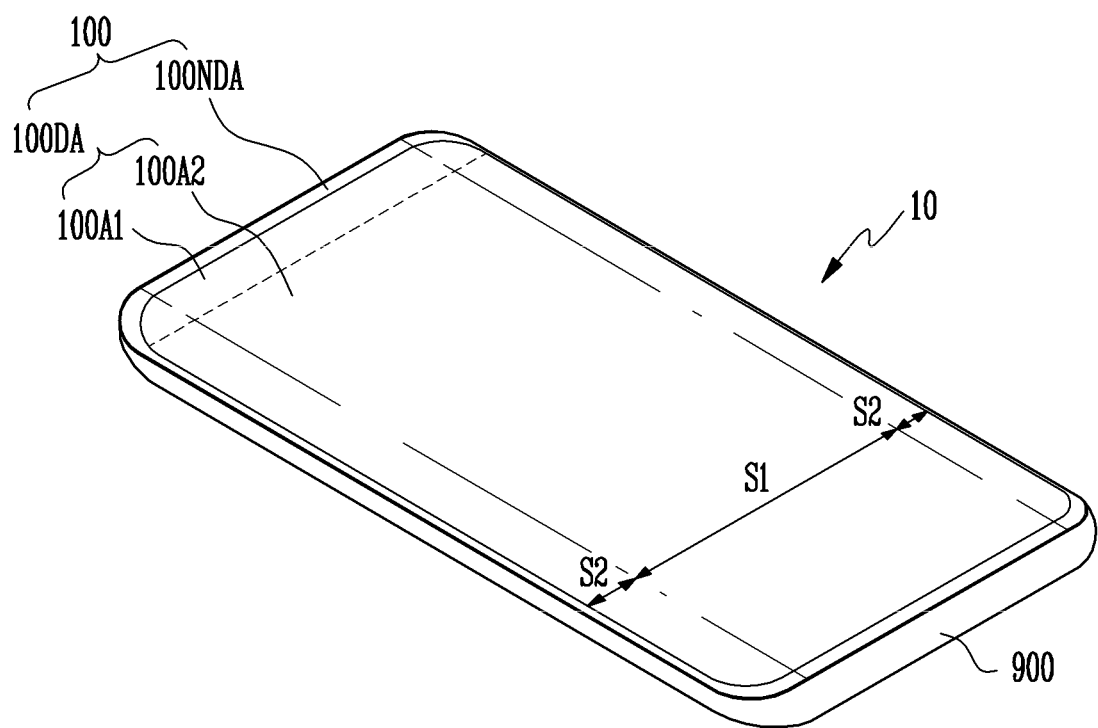
FIG. 1 is a perspective view of a display device according to some example embodiments of the present disclosure.

Aspects of some example embodiments disclosed in the present specification are provided only for illustrative purposes and for full understanding of the scope of the present disclosure by those skilled in the art. However, the present disclosure is not limited to the example embodiments, and it should be understood that the present disclosure includes modification examples or change examples without departing from the spirit and scope of the present disclosure.

The terms used in the specification has been selected as general terms currently widely used if possible considering the functions in the present disclosure, but they may depend on the intentions of those skilled in the art, practice, the appearance of new technologies, etc. In addition, specific cases use the terms selected arbitrarily by the applicant and in these cases, their meaning will be described when describing corresponding disclosures. Thus, it should be noted that the terms used in the specification should be construed on the basis of their actual meanings and contents through the specification, not just names thereof.

The drawings attached to the present specification are provided to easily explain the present disclosure, and the shapes shown in the drawings may be exaggerated and displayed as necessary to help understanding of the present disclosure, and thus the present disclosure is not limited to the drawings.

In the present specification, when it is determined that a detailed description of a known configuration or function related to the present disclosure may obscure the gist of the present disclosure, a detailed description thereof will be omitted as necessary.

The present disclosure generally relates to a display device, and more particularly, to a display device having a transmission window through which light can be efficiently transmitted.

Hereinafter, a display device according to some example embodiments of the present disclosure will be described with reference to FIGS. 1 to 18.

Figure 2:
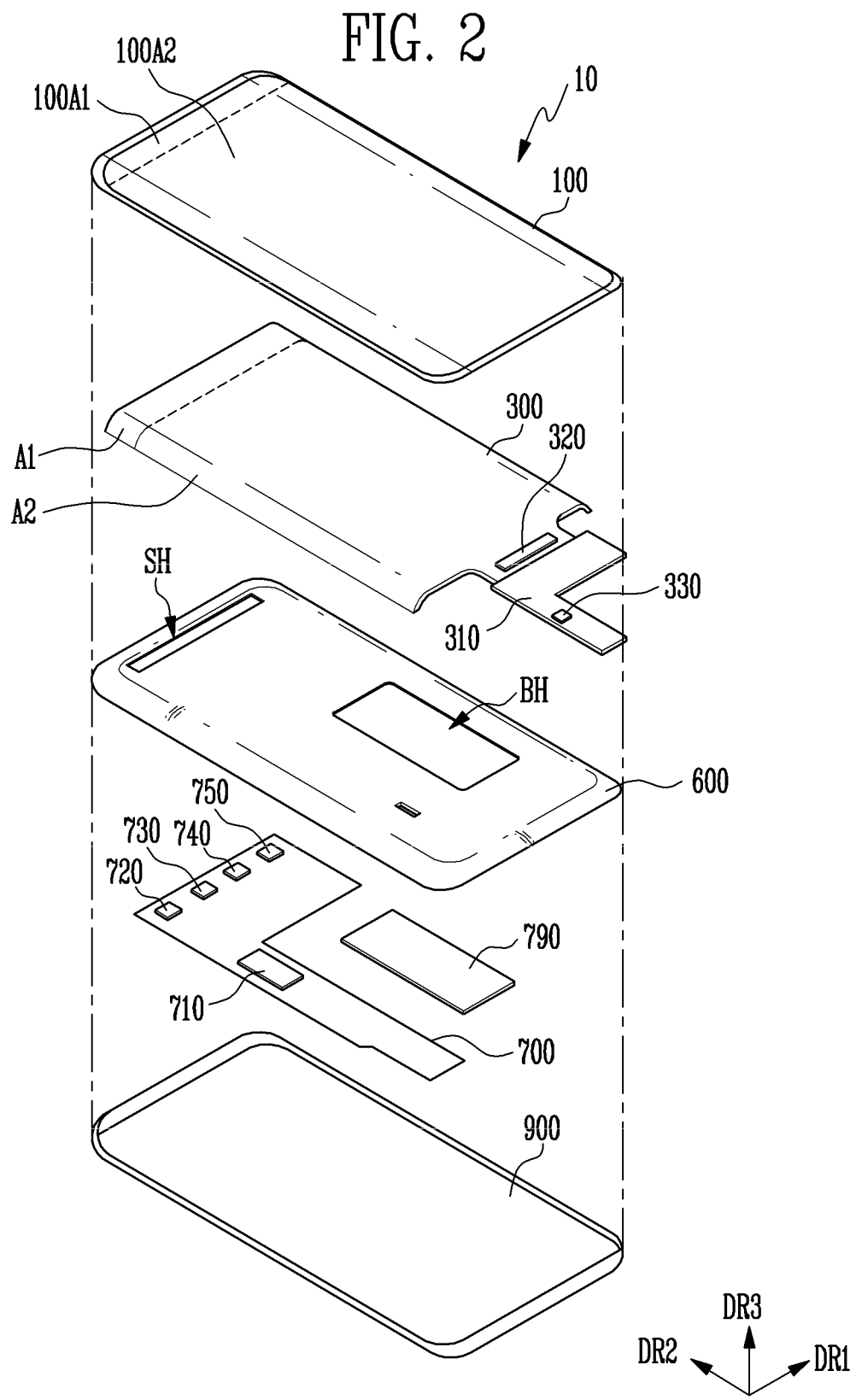
FIG. 2 is an exploded perspective view of the display device shown in FIG. 1.

FIG. 1 is a perspective view of a display device according to some example embodiments of the present disclosure. FIG. 2 is an exploded perspective view of the display device shown in FIG. 1.

The display device 10 means a device capable of providing visual data to a user. In an example, the display device 10 may include not only potable electronic devices such as a mobile phone, a smart phone, a tablet personal computer (PC), a smart watch, a watch phone, a mobile communication terminal, an electronic notebook, an electronic book, a portable multimedia player (PMP), a navigation system, and an ultra-mobile PC but also various products such as a television, a notebook computer, a monitor, an advertising board, and Internet of things (IOT). However, embodiments according to the present disclosure are not limited to the above-described specific example.

The display device 10 may include a first surface S1 formed flat and a second surface S2 extending from a left/right side of the first surface S1. The second surface S2 may be formed flat or formed as a curved surface. When the second surface is formed flat, the angle formed by the first surface S1 and the second surface S2 may be an obtuse angle. When the second surface S2 is formed as the curved surface, the second surface S2 may have a constant curvature or have a changed curvature.

Although a case where the second surface S2 extends from each of the left/right sides of the first surface S1 is illustrated as an example in FIG. 1, embodiments according to the present disclosure are not limited thereto. That is, the second surface S2 may extend from any one of the left/right sides of the first surface S1. Also, the second surface S2 may extend from at least one of upper/lower sides of the first surface S1, in addition to the left/right sides of the first surface S1. Hereinafter, a case where the second surface S2 is located at left/right edges of the display device 10 will be mainly described.

The display device 10 may include a cover window, a bracket 600, a main circuit board 700, and a lower cover 900.

The cover window 100 may be located on the first surface S1 and the second surface S2.

The cover window 100 may include a light transmission part 100DA corresponding to a display panel 300 and a light blocking part 100NDA corresponding to a region except the display panel 300.

The light transmission part 100DA may be located at a portion of the first surface S1 and/or a portion of the second surface S2. The light blocking part 100NDA may be formed opaque. In an example, the light blocking part 100NDA may be provided as a decoration layer including a pattern which can be viewed by a user.

The light transmission part 100DA may include a first light transmission part 100A1 corresponding to a first region A1 of the display panel 300 and a second light transmission part 100A2 corresponding to a second region A2 of the display panel 300.

The display panel 300 may be positioned on the bottom of the cover window 100. The display panel 300 may be arranged to overlap with the light transmission part 100DA of the cover window 100.

A portion of the display panel 300 may be arranged on the first surface S1, and another portion of the display panel 300 may be arranged on the second surface S2. Therefore, light from the display panel 300 may be output not only at the first surface S1 but also at the second surface S2.

The display panel 300 may include the first region A1 and the second region A2.

The first region A1 may be arranged to overlap with the first light transmission part 100A1 of the cover window 100. The second region A2 may be arranged to overlap with the second light transmission part 100A2 of the cover window 100.

The display panel 300 may include a light emitting element capable of emitting light when an electrical signal is provided. In an example, the display panel 300 may be at least one of an organic light emitting display panel including an organic light emitting diode, a micro light emitting diode display panel including a micro light emitting diode, a quantum dot light emitting display panel include a quantum dot light emitting diode including a quantum dot light emitting layer, and an inorganic light emitting display panel including an inorganic light emitting diode to which an inorganic semiconductor is applied. However, embodiments according to the present disclosure are not limited to the above-described example.

Hereinafter, a case where the display panel 300 is the organic light emitting display panel including the organic light emitting diode will be mainly described for convenience.

A display circuit board 310 and a display driving circuit 320 may be positioned at one side of the display panel 300. One end of the display circuit board 310 may be attached onto pads provided at one side of the display panel 300 by using an anisotropic conductive film. The display circuit board 310 may be a Flexible Printed Circuit Board (FPCB) which is bendable, but embodiments according to the present disclosure are not limited thereto.

The display driving circuit 320 may be applied with control signals and power voltages through the display circuit board 310, and generate and output signals and voltages, which are used to drive the display panel 300. The display driving circuit 320 may be formed as an Integrated Circuit (IC). The display driving circuit 320 may be arranged on the display panel 300. For example, the display driving circuit 320 may be attached onto the display panel 300 by using a Chip On Glass (COG) method, a Chip On Plastic (COP) method, or an ultrasonic bonding method. Alternatively, the display driving circuit 320 may be arranged on the display circuit board 310.

A sensing driver 330 may be located on the display circuit board 310. The sensing driver 330 may be formed as an IC. The sensing driver 330 may be attached onto the display circuit board 310.

The sensing driver 330 may be electrically connected to sensing electrodes (see 'TE,' and 'RE' shown in FIG. 10) of a sensing layer (see 'SL' shown in FIG. 7) of the display panel 300 through the display circuit board 310. The sensing layer SL may be configured to obtain information on a touch input applied from the outside.

The bracket 600 may be located on the bottom of the display panel 300. The bracket 600 may include at least one of plastic and metal, but embodiments according to the present disclosure are not limited thereto.

The bracket 600 may include a sensor hole SH and a battery hole BH. Panel lower sensors 720, 730, 740, and 750 may be located in the sensor hole SH, and a battery 790 may be located in the battery hole BH. The sensor hole SH and the battery hole BH may have a through hole shape formed along a thickness direction of the bracket 600. The sensor hole SH may be arranged to overlap with the first region A1 in a plan view. The sensor hole SH may be arranged to overlap with a transmissive part (see 'TA' shown in FIG. 9) in a plan view. The main circuit board 700 and the battery 790 may be located on the bottom of the bracket 600. The main circuit board 700 may be a Printed Circuit Board (PCB) or an FPCB.

The main circuit board 700 may include a main processor 710 and the panel lower sensors 720, 730, 740, and 750. The panel lower sensors 720, 730, 740, and 750 may be located on a top surface of the main circuit board 700. The panel lower sensors 720, 730, 740, and 750 may be arranged to overlap with the first region A1. The panel lower sensors 720, 730, 740, and 750 may be arranged to overlap with the transmissive part TA.

The main processor 710 may control the display device 10. The main processor 710 may be implemented as a CPU or a device similar thereto according to hardware, software, or a combination thereof. For example, the main processor 710 may output digital video data to the display driving circuit 320 through the display circuit board 310 such that the display panel 300 displays an image. Also, the main processor 710 may receive sensing data input from the sensing driver 330, determine a touch coordinate of a user, and then execute an application indicated by an icon displayed on the touch coordinate. Also, the main processor

710 may control the display device 10 according to sensing signals input from the channel lower sensors 720, 730, 740, and 750.

The channel lower sensors 720, 730, 740, and 750 may be configured to obtain electrical information, based on information (e.g., light intensity, emission frequency, light spectrum, temperature, etc.) applied from the outside. The channel lower sensors 720, 730, 740, and 750 may include a proximity sensor 720, an illuminance sensor 730, an iris sensor 740, and a camera device 750.

The proximity sensor 720 may sense whether an object is arranged close to a top surface of the display device 10. The proximity sensor 720 may include a light source that is configured to output light and a light receiving part which receives light reflected by an object. The proximity sensor 720 may determine whether any object located close to the top surface of the display device 10 exists according to an amount of the light reflected by the object. Accordingly, the proximity sensor 720 may generate a proximity sensor signal and output the proximity sensor signal to the main processor 710.

The illuminance sensor 730 may sense brightness of the top surface of the display device 10. To this end, the illuminance sensor 730 may include a resistor having a resistance value changed according to the brightness of incident light. The illuminance sensor 730 may determine brightness of the top surface of the display device 10 according to the resistance value of the resistor. The illuminance sensor 730 may generate an illuminance sensor signal according to the brightness of the top surface of the display device 10, and output the illuminance sensor signal to the main processor 710.

The iris sensor 740 may sense whether an image obtained by photographing an iris is identical to an iris image pre-stored in a memory. Accordingly, the iris sensor 740 may generate an iris sensor signal and output the iris sensor signal to the main processor 710.

The camera device 750 may process an image frame such as a still image or a moving image, which is obtained by an image sensor in a camera mode, and output the processed image frame to the main processor 710. The camera device 750 may include an image sensor which receives light provided through the transmissive part TA of the first region A1. Although a case where the channel lower sensors 720, 730, 740, and 750 are the proximity sensor 720, the illuminance sensor 730, the iris sensor 740, and the camera device 750 has been illustrated as an example in FIG. 2, embodiments according to the present disclosure are not necessarily limited thereto, and the channel lower sensors 720, 730, 740, and 750 may further include an infrared sensor and/or an ultrasonic sensor.

The battery 790 may be arranged such that it does not overlap with the main circuit board 700, in a plan view. The battery 790 may be located to overlap with the battery hole BH of the bracket 600.

The lower cover 900 may be located on the bottom of the main circuit board 700 and the battery 790. The lower cover 900 may be fastened to the bracket 600 to be fixed to the bracket 600. The lower cover 900 may form the appearance of a bottom surface of the display device 10. The lower cover 900 may include at least one of plastic and metal.

Figure 3:
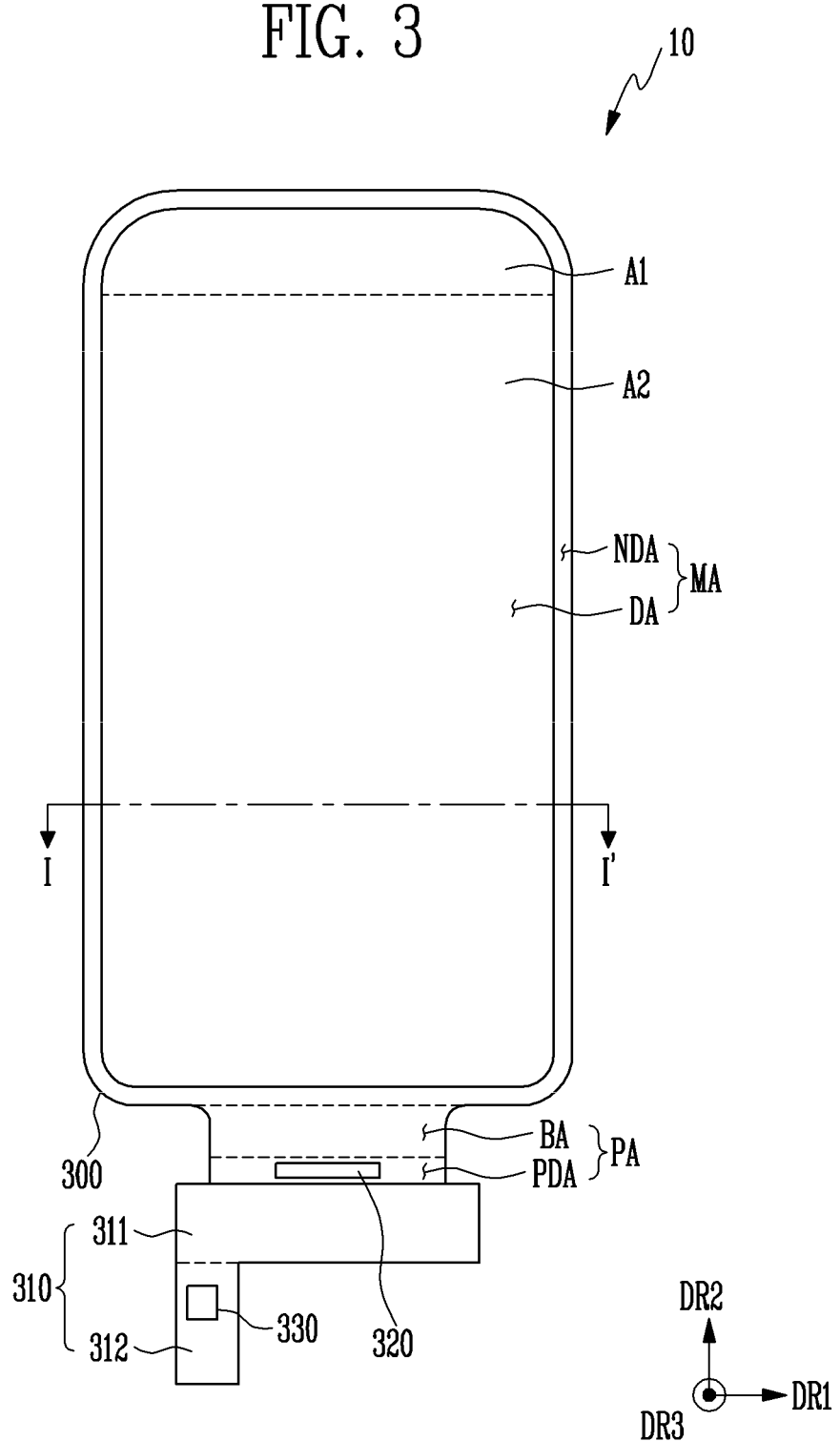
FIGS. 3 and 4 are plan views of a display device according to some example embodiments of the present disclosure.
Figure 4:
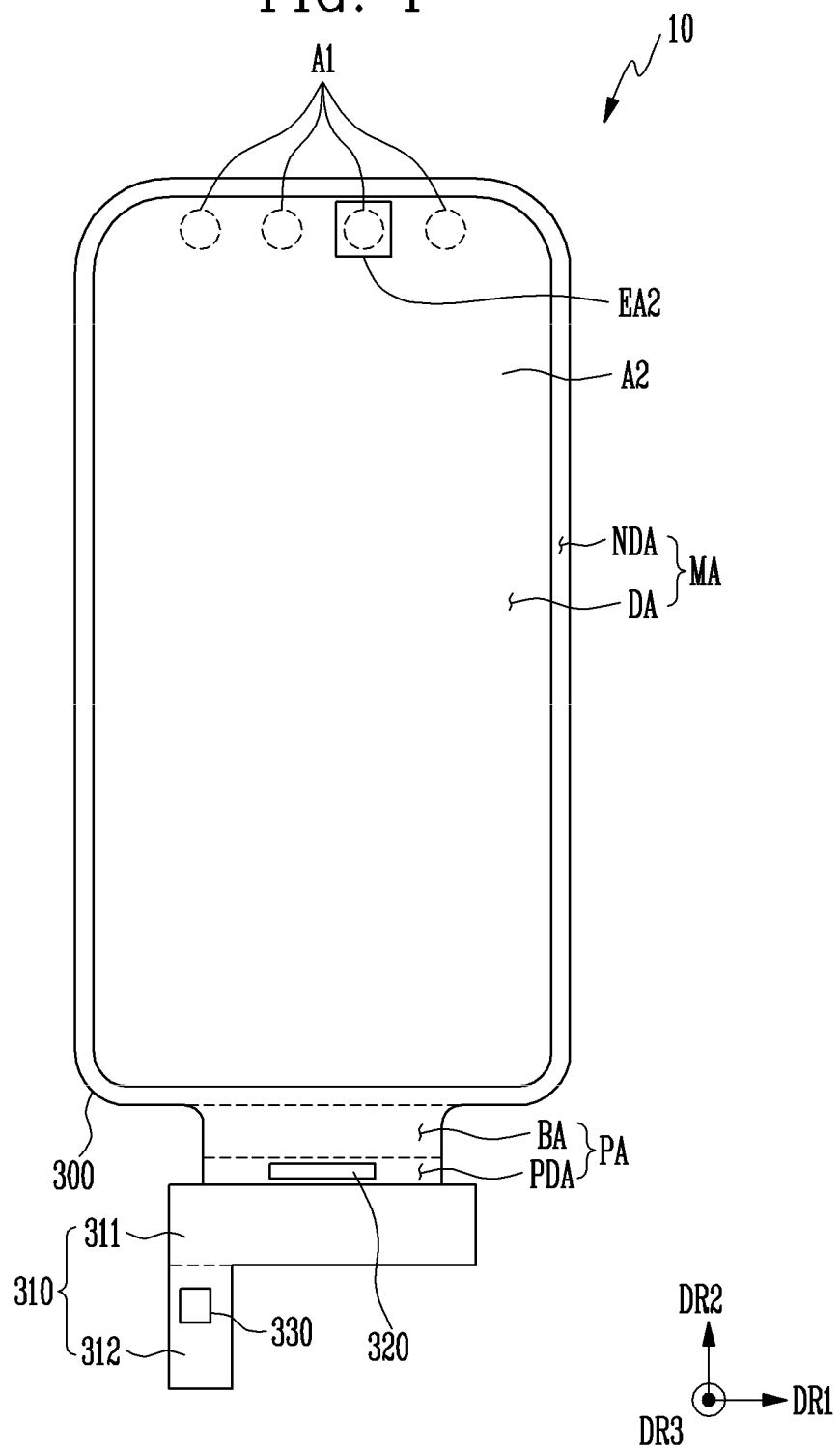
Figure 5:
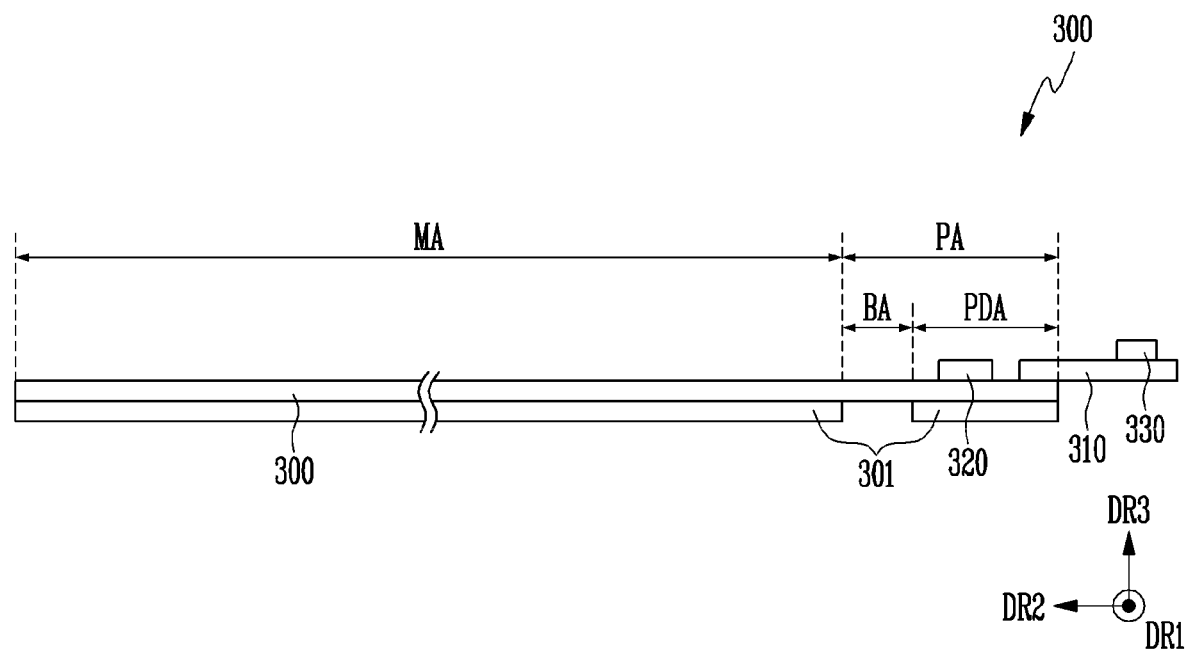
FIGS. 5 and 6 are side views of a display panel included in the display device according to some example embodiments of the present disclosure.
Figure 6:
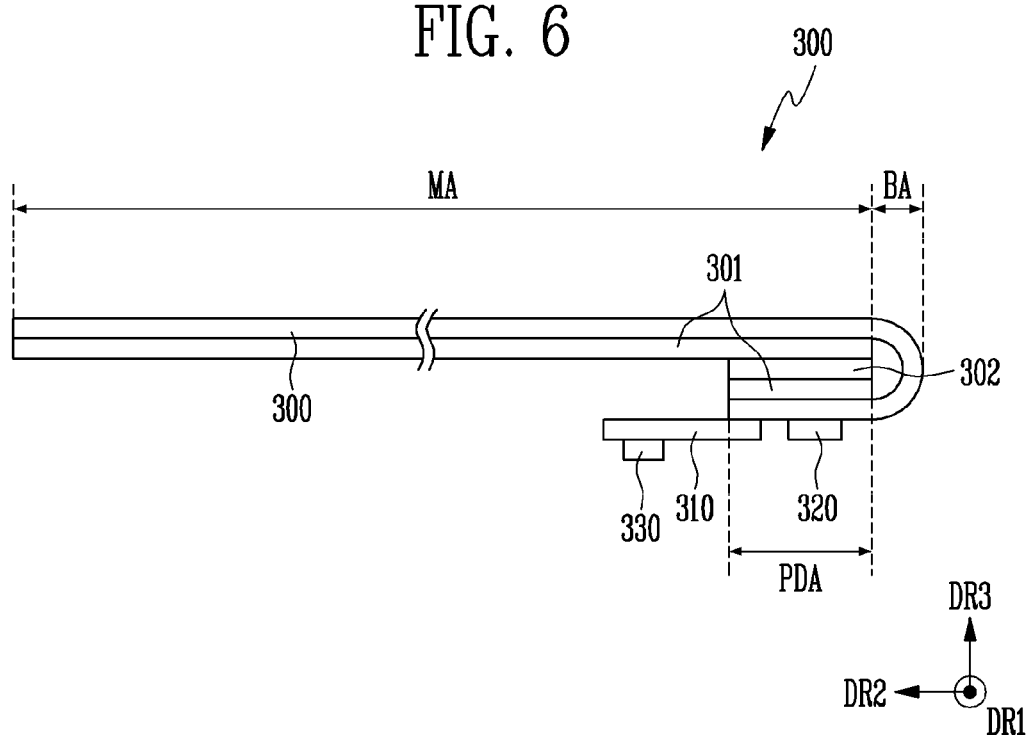

FIGS. 3 and 4 are plan views of a display device according to some example embodiments of the present disclosure. FIGS. 5 and 6 are side views of a display panel included in the display device according to some example embodiments of the present disclosure.

The display panel 300 may include a main region MA and a protrusion region PA protruding from one side of the main region MA. Also, the display panel 300 may include a pixel (see 'SP' shown in FIG. 8), a scan line (see 'GL' shown in FIG. 8, a data line (see 'DL' shown in FIG. 8), and a power line.

The main region MA may include a display region DA in which the pixel SP is formed to display an image and a non-display region NDA as a peripheral region of the display region DA.

The display region DA may include a first region A1 and a second region A2. The first region A1 and the second region A2 may be provided in various shapes. According to some example embodiments, as shown in FIG. 4, the first region A1 may be surrounded by the second region A2. Alternatively, as shown in FIG. 3, the second region A2 may be partitioned from the first region A1 along a first direction DR1. However, embodiments according to the present disclosure are not limited the above-described example, each of the first region A1 and the second region A2 may be located at at least a portion in the display region DA.

The first region A1 may be configured in plurality. A number of first regions A1 may correspond to that of the above-described panel lower sensors 720, 730, 740, and 750, and each of the panel lower sensors 720, 730, 740, and 750 may be arranged to overlap with one first region A1.

An area of the first region A1 may be different from that of the second region A2. For example, the area of the first region A1 may be smaller than that of the second region A1, but embodiments according to the present disclosure are not limited thereto.

The protrusion region PA may protrude from one side of the main region MA. For example, the protrusion region PA may protrude from a lower side of the main region MA as shown in FIG. 3. A length of the protrusion region PA in the first direction DR1 may be smaller than that of the main region MA in the first direction DR1.

The protrusion region PA may include a bending region BA and a pad region PDA. The pad region PDA may be located at one side of the bending region BA, and the main region MA may be located at the other side of the bending region BA. That is, the bending region BA may be located between the main region MA and the pad region PDA.

The display panel 300 may be flexibly formed, to be warped, curved, bent, folded or rolled. Therefore, the display panel 300 may be bent in a thickness direction (a third direction DR3) thereof in the bending region BA. Before the display panel 300 is bent as shown in FIG. 5, one surface of the pad region PDA of the display panel 300 may face upward. When the display panel 300 is bent as shown in FIG. 6, the one surface of the pad region PDA of the display panel 300 may face downward. Therefore, because the pad region PDA is located under the main region MA, the pad region PDA may overlap with the main region MA.

Pads electrically connected to a display driving circuit 320 and a display circuit board 310 may be located in the pad region PDA of the display panel 300.

A panel protective film 301 may be located on the bottom of the display panel 300. The panel protective film 301 may be attached to a bottom surface of the display panel 300 through an adhesive member. The adhesive member may be a Pressure Sensitive Adhesive (PSA).

The panel protective film 301 may include a light absorbing member for absorbing light incident from the outside, a shock absorbing member for absorbing an impact from the outside, a heat dissipation member for efficiently dissipating heat of the display panel 300, or the like.

The light absorbing member may be located on the bottom of the display panel 300. The light absorbing member blocks transmission of light, so that components, e.g., the display driving circuit 320, etc., which are located on the bottom of the light absorbing member, are prevented from being viewed from the top of the display panel 300. The light absorbing member may include a light absorbing material such as a black dye or a black pigment.

The shock absorbing member may be located on the bottom of the light absorbing member. The shock absorbing member absorbs an external impact, thereby preventing or reducing damage of the display panel 300. The shock absorbing member may be provided a single layer or a multi-layer. For example, the shock absorbing member may be formed of a polymer resin such as polyurethane, polycarbonate, polypropylene or polyethylene, or include a sponge formed by foaming rubber, a urethane material or an acrylic material. The shock absorbing member may be a cushion layer.

The heat dissipation member may be located on the bottom of the shock absorbing member. The heat dissipation member may include a first heat dissipation layer including graphite, carbon nanotubes, etc. and a second heat dissipation layer which shields an electromagnetic wave together with the first heat dissipation layer and is formed as a metal thin film such as copper, nickel, ferrite or silver, which has excellent thermal conductivity.

In order for the display panel 300 to be easily warped, the panel protective film 301 may not be located in the bending region BA of the display panel 300 as shown in FIG. 5. Because the pad region PDA is located under the main region MA when the display panel 300 is warped in the bending region BA, and the pad region PDA may overlap with the main region MA. Accordingly, the panel protective film 301 located in the main region MA of the display panel 300 and the panel protective film 301 located in the pad region PDA of the display panel 300 can be attached by an adhesive member 302. The adhesive member 302 may be a PSA.

According to some example embodiments, a panel lower cover may be further located on the bottom of the panel protective film 301. The panel lower cover is located on the bottom of the panel protective film 301 located in the main region MA, and may not be located in the bending region BA and the pad region PDA. According to some example embodiments, when the pad region PDA is located under the main region MA when the display panel 300 is warped in the bending region BA, the panel lower cover may at least partially overlap with the pad region PDA.

The display driving circuit 320 outputs signals and voltages, which are used to drive the display panel 300. For example, the display driving circuit 320 may supply data voltages to data lines. Also, the display driving circuit 320 may supply a power voltage to the power line, and supply scan control signals to a scan driver. The display driving circuit 320 may be formed as an Integrated Circuit (IC), to be mounted on the display panel 300 in the pad region PDA by using a Chip On Glass (COG) method, a Chip On Plastic (COP) method, or an ultrasonic bonding method, but embodiments according to the present disclosure are not limited thereto. For example, the pads may include display pads electrically connected to the display driving circuit 320 and sensing pads electrically connected to sensing lines.

The display circuit board 310 may be attached onto the pads by using an anisotropic conductive film. Therefore, lead lines of the display circuit board 310 may be electrically connected to the pads. The display circuit board 310 may be a flexible printed circuit board, a printed circuit board, or a flexible film such as a chip on film.

A sensing driver 330 may be connected to the sensing electrodes of the sensing layer of the display panel 300. The sensing driver 330 applies driving signals to the sensing electrodes of the sensing layer, and measures mutual capacitance values of the sensing electrodes. The driving signal may be a signal having a plurality of driving pulses. The sensing driver 330 may determine whether a user has touched the display panel 300, whether the user has come close to the display panel 300, etc. according to the mutual capacitance values.

The sensing driver 330 may be located on the display circuit board 310. The sensing driver 330 may be formed as an IC, to be mounted on the display circuit board 310.

Figure 7:
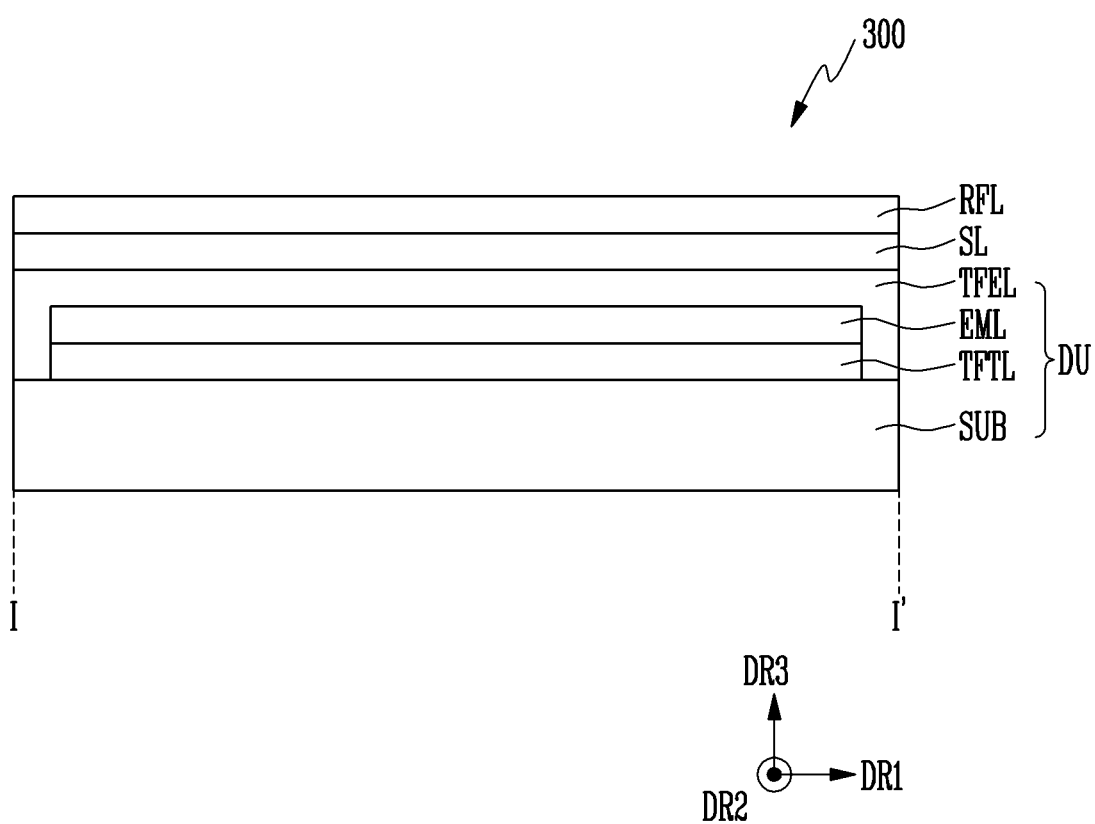
FIG. 7 is a sectional view taken along the line I-I' shown in FIG. 3.

FIG. 7 is a sectional view taken along the line I-I' shown in FIG. 3.

Referring to FIG. 7, the display panel 300 may include a display unit DU, a sensing layer SL, and an anti-reflective layer RFL. The display unit DU may include a substrate SUB, a thin film transistor layer TFTL, a light emitting element layer EML, and a thin film encapsulation layer TFEL.

The substrate SUB may be a rigid substrate or a flexible substrate which is bendable, foldable, rollable, etc. When the substrate SUB is the flexible substrate, the substrate SUB may be made of polyimide, but embodiments according to the present disclosure are not limited thereto.

The thin film transistor layer TFTL may be located on the substrate SUB. Scan lines, data lines, power lines, scan control lines, routing lines connecting the pads and the data lines, and the like, in addition to thin film transistors of each pixel, may be formed in the thin film transistor layer TFTL. Each of the thin film transistors may include a gate electrode, a semiconductor layer, a source electrode, and a drain electrode.

The thin film transistor layer TFTL may be located in the display region DA and the non-display region NDA. For example, the thin film transistors, the scan lines, the data lines, and the power lines of the thin film transistor layer TFTL may be located in the display region DA.

The light emitting element layer EML may be located on the thin film transistor layer TFTL.

The light emitting element layer EML may include pixels including a first electrode, a light emitting layer, and a second electrode, and a pixel defining layer defining an emission region of the pixels. The light emitting layer may be an organic light emitting layer including an organic material. The light emitting layer may include a hole transporting layer, an organic light emitting layer, and an electron transporting layer.

When a predetermined voltage is applied to the first electrode through the thin film transistors of the thin film transistor layer TFTL, and a cathode voltage is applied to the second electrode, holes and electrons are moved to the organic light emitting layer respectively through the hole transporting layer and the electron transporting layer, and are combined with each other in the organic light emitting layer, thereby emitting light. The pixel SP of the light emitting element layer EML may be located in the display region DA.

The thin film encapsulation layer TFEL may be located on the light emitting element layer EML. The thin film encapsulation layer TFEL may function to prevent or reduce oxygen, moisture, or other contaminants penetrating into the light emitting element layer EML. To this end, the thin film encapsulation layer TFEL may include at least one inorganic layer. The inorganic layer may be a silicon nitride layer, a silicon oxynitride layer, a silicon oxide layer, a titanium oxide layer, or an aluminum oxide layer, but embodiments according to the present disclosure are not limited thereto.

Also, the thin film encapsulation layer TFEL may function to protect the light emitting element layer EML from a foreign substance such as dust. To this end, the thin film encapsulation layer TFEL may include at least one organic layer. The organic layer may be acryl resin, epoxy resin, phenolic resin, polyamide resin, or polyimide resin, but embodiments according to the present disclosure are not limited thereto.

The thin film encapsulation layer TFEL may be arranged throughout the display region DA and the non-display region NDA. For example, the thin film encapsulation layer TFEL may be arranged to cover the light emitting element layer EML and the thin film transistor layer TFTL of the display region DA and the non-display region NDA.

The sensing layer SL may be positioned on the thin film encapsulation layer TFTL.

Figure 10:
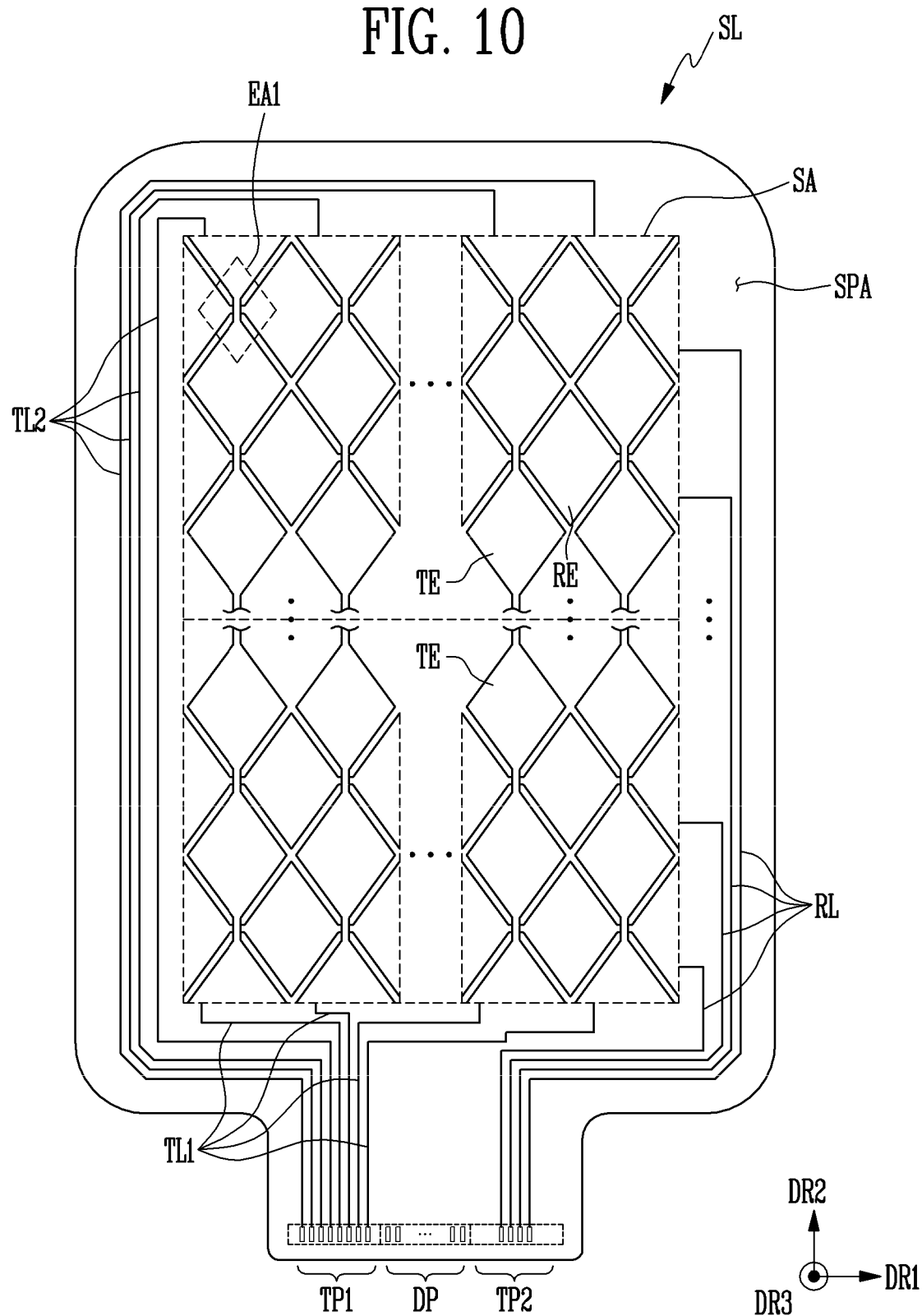
FIG. 10 is a plan view illustrating a sensing layer shown in FIG. 7.

The sensing layer SL may include sensing electrodes TE and RE, sensing pads (see 'TP1 and TP2' shown in FIG. 10), and sensing lines (see 'TL1, TL2, and RL' shown in FIG. 10. The sensing layer SL will be described in detail with reference to FIGS. 10 to 12.

The anti-reflective layer RFL may be located on the sensing layer SL. The anti-reflective layer RFL may function to block external light reflection. To this end, the anti-reflective layer RFL may include a light blocking layer made of a light blocking material. Accordingly, a separate polarizing plate can be omitted. Thus, a decrease in luminance of the display device 10 can be prevented or reduced, and the thickness of the display panel 300 can be minimized or reduced.

Figure 8:
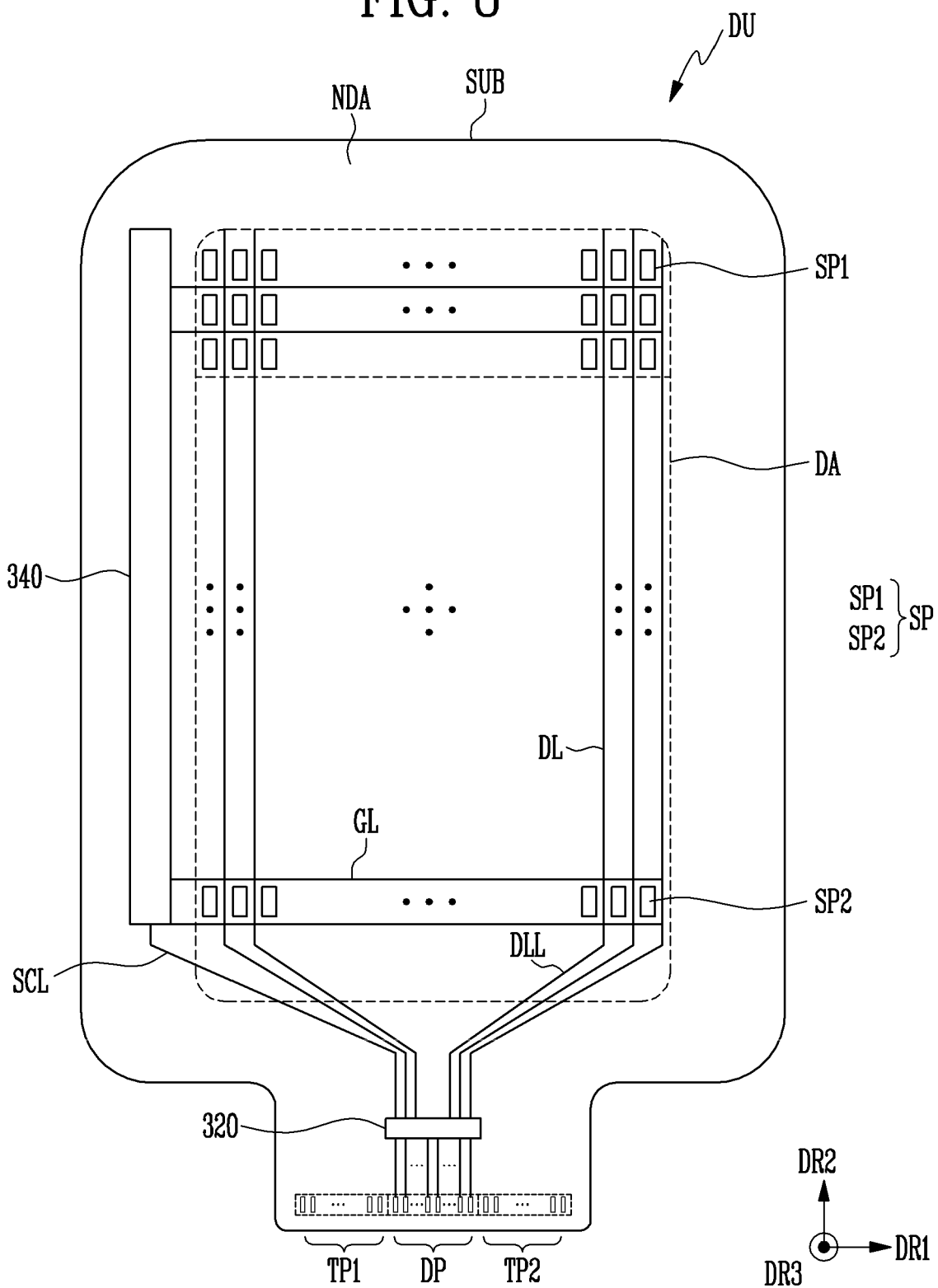
FIG. 8 is a plan view illustrating a sensing electrode of the display device according to some example embodiments of the present disclosure.

FIG. 8 is a plan view illustrating a sensing electrode of the display device according to some example embodiments of the present disclosure.

In FIG. 8, a pixel SP of the display unit DU, scan lines GL, data lines DL, a scan control line SCL, a fan-out line DLL, a scan driver 340, a display driving circuit 320, and a display pad DP are mainly illustrated for convenience of description.

Referring to FIG. 8, the pixel SP, the scan line GL, and the data line DL may be located in the display region DA.

The pixel SP may include a first pixel SP1 located in the first region A1 and a second pixel SP2 located in the second region A2. Hereinafter, the first pixel SP1 and the second pixel SP2 will be described in detail with reference to FIG. 9.

Figure 9:
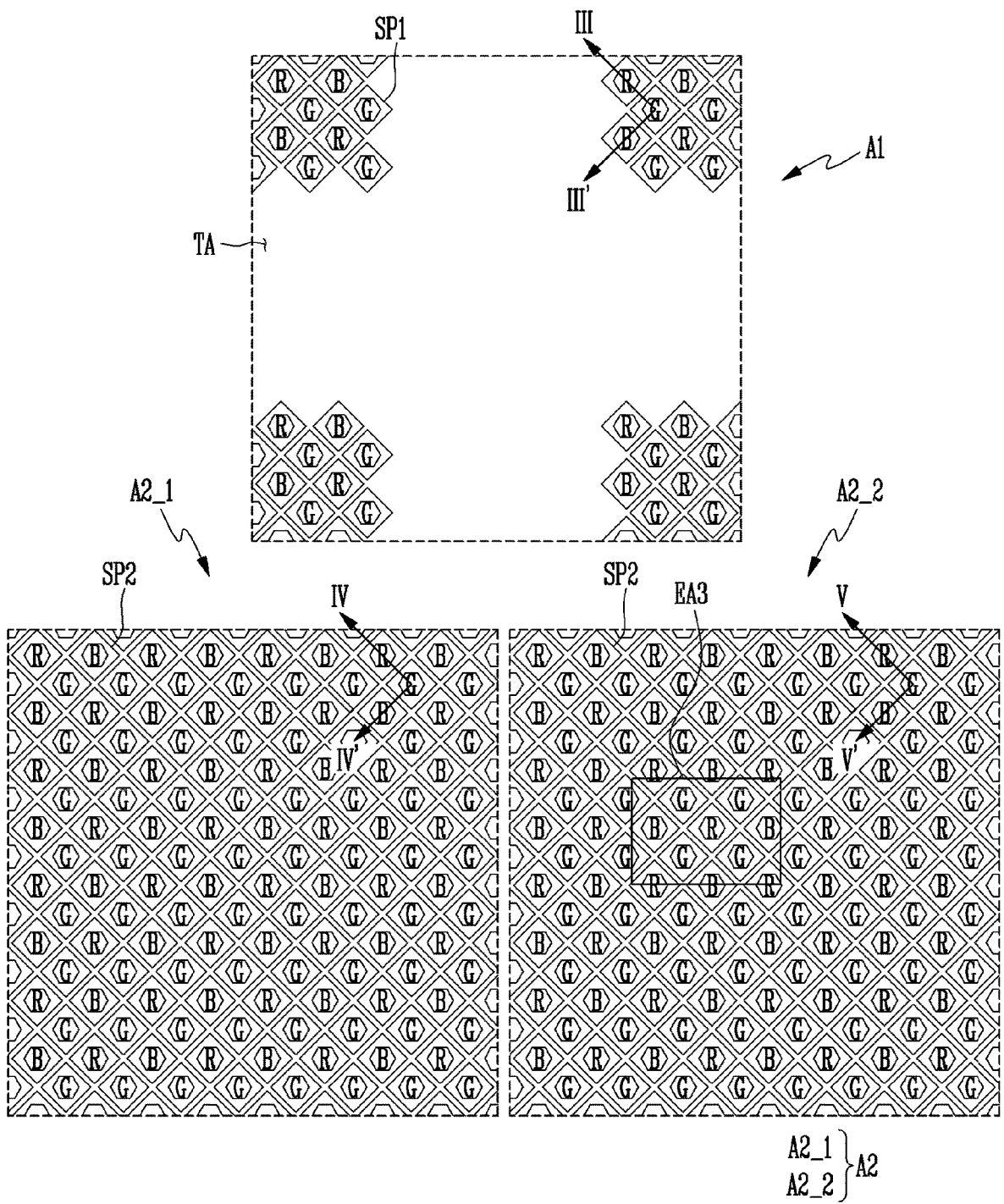
FIG. 9 is a plan view illustrating a first region and a second region, which are shown in FIG. 4.

FIG. 9 is a plan view illustrating the first region and the second region, which are shown in FIG. 4.

Referring to FIG. 9, the first region A1 may include a first pixel SP1 and a transmissive part TA surrounded by the first pixel SP1. The transmissive part TA is a region in which the first pixel SP1 is not located, and may not overlap with the first pixel SP1 in a plan view. The transmissive part TA may include a path through which light is provided from the outside.

The second region A2 may include a (2-1)th region A2_1 and a (2-2)th region A2_2. The (2-1)th region A2_1 is a region adjacent to the first region A1 in the second region A2, and may mean a region including a detour line (see '224' shown in FIG. 15). The (2-2)th region A2_2 may mean a region including a dummy line (see '228' shown in FIG. 16) in the second region A2. The (2-1)th region A2_1 and the (2-2)th region A2_2 will be described in detail later with reference to FIGS. 15 to 18, and therefore, overlapping descriptions will be omitted.

The second region A2 may not include the transmissive part TA. Because the transmissive part TA is partially formed in the first region A1, a number of first pixels SP1 per unit area in the first region A1 may be different from that of second pixels SP2 per unit area in the second region A2. For example, the number of first pixels SP1 per unit area in the first region A1 may be smaller than that of second pixels SP2 per unit area in each of the (2-1)th region A2_1 and the (2-2)th region A2_2. In addition, a size of the first pixel SP1 may be different from that of the second pixel SP2.

The transmissive part TA of the first region A1 may overlap with the panel lower sensors 720, 730, 740, and 750 described with reference to FIG. 2 in a thickness direction thereof. The transmissive part TA may provide a path through which light from the top of the display panel 300 can be incident into the panel lower sensors 720, 730, 740, and 750. To this end, a portion of a layer constituting the thin film transistor layer TFTL and the light emitting element layer EML may be omitted in the transmissive part TA. Thus, although the panel lower sensors 720, 730, 740, and 750 are arranged to overlap with the display panel 300, deterioration of sensing capability of the panel lower sensors 720, 730, 740, and 750 can be prevented or reduced, which is as described above.

Each of the first pixel SP1 and the second pixel SP2 may include a first sub-pixel R emitting light of a first color, a second sub-pixel G emitting light of a second color, and a third sub-pixel B emitting light of a third color.

Although a case where the first sub-pixel R and the third sub-pixel B are alternately arranged on the first column and the second sub-pixel G is arranged on the second column is illustrated as an example in FIG. 9, embodiments according to the present disclosure are not limited thereto.

Also, although a case where the sub-pixels R, G, and B having the same shape and the same size is illustrated as an example in FIG. 9, embodiments according to the present disclosure are not limited thereto. For example, the sub-pixels R, G, and B have different shapes and different sizes. In this case, the size of the third sub-pixel B may be largest, and the size of the second sub-pixel G may be smallest. However, embodiments according to the present disclosure are not limited thereto.

Also, the first region A1 and the second region A2, which are shown in FIG. 9, merely illustrate an example among arrangements of the pixels SP, and the arrangement of the pixels SP defined in the first region A1 and the second region A2 may be variously modified.

Referring back to FIG. 8, the scan lines GL may be formed in parallel in the first direction DR1, and the data lines DL may be formed in a second direction DR2 intersecting the first direction DR1.

Each of the first pixel SP1 and the second pixel SP2 may be connected to at least one of the scan lines GL and any one of the data lines DL. Each of the first pixel SP1 and the second pixel SP2 may include thin film transistors including a driving transistor and at least one switching transistors, a light emitting element, and a capacitor.

Each of the first pixel SP1 and the second pixel SP2 may be supplied with a data voltage of the data line DL when a scan signal is applied from the scan line GL, and supply a driving current to the light emitting element according to the data voltage applied to a gate electrode, thereby emitting light. Although a case where the light emitting element is an organic light emitting element including a first electrode, an organic light emitting layer, and a second electrode is mainly described, embodiments according to the present disclosure are not limited thereto. That is, the light emitting element may be implemented as a quantum dot light emitting element including a first electrode, a quantum dot, a light emitting layer, and a second electrode, an inorganic light emitting element including a first electrode, an inorganic light emitting layer having an inorganic semiconductor, and a second electrode, or a micro light emitting element including a micro light emitting diode.

The scan driver 340 is connected to the display driving circuit 320 through a plurality of scan control lines SCL. Therefore, the scan driver 340 may receive a scan control signal input from the display driving circuit 320. The scan driver 340 may generate scan signals according to the scan control signal and supply the scan signals to the scan lines GL.

Although a case where the scan driver 340 is formed in the non-display region NDA at the left outside of the display region DA is illustrated as an example in FIG. 8, embodiments according to the present disclosure are not limited thereto. For example, the scan driver 340 may be formed in the non-display region NDA at the left outside and the right outside of the display region DA.

The display driving circuit 320 may be connected to the display pad DP to receive digital video data and timing signals. The display driving circuit 320 may convert the digital video data into analog positive/negative data voltages, and supply the positive/negative data voltages to the data line DL through the fan-out line DLL. Also, the display driving circuit 320 may generate and supply a scan control signal for controlling the scan driver 340 through the plurality of scan control lines SCL. Pixels SP to which the data voltages are to be supplied may be selected by the scan signals of the scan driver 340, and the data voltages may be supplied to the selected pixels SP.

Figure 11:
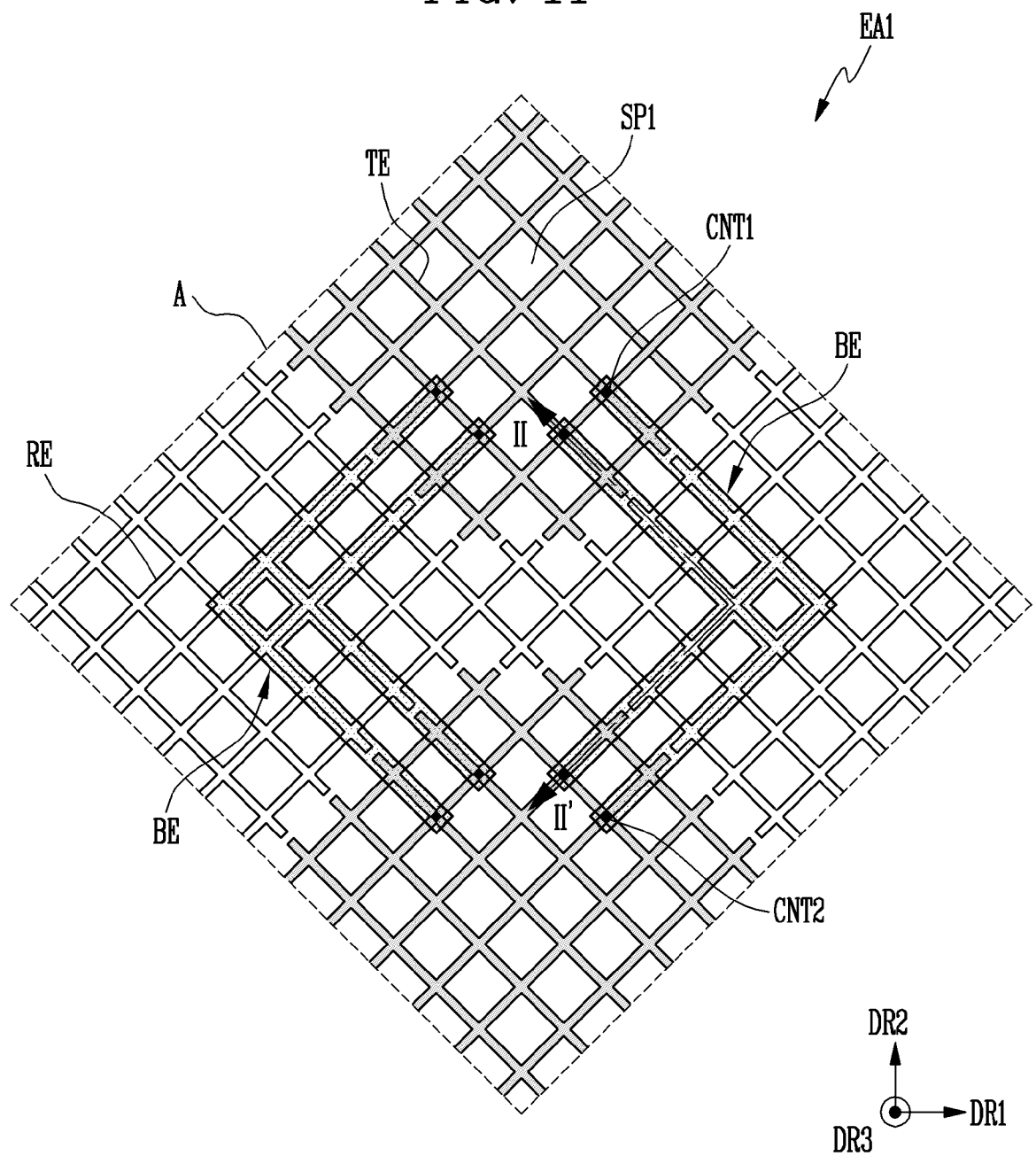
FIG. 11 is an enlarged view of region EA1 shown in FIG. 10.
Figure 12:
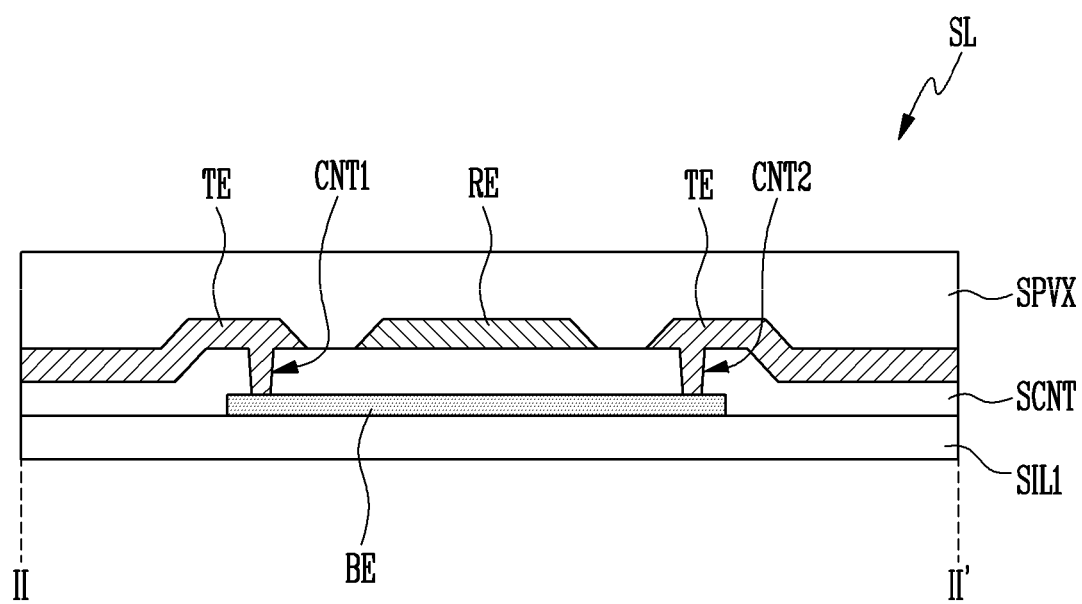
FIG. 12 is a sectional view taken along the line II-II' shown in FIG. 11.

FIG. 10 is a plan view illustrating the sensing layer shown in FIG. 7. FIG. 11 is an enlarged view of region EA1 shown in FIG. 10. FIG. 12 is a sectional view taken along line II-II' shown in FIG. 11.

Referring to FIGS. 10 to 12, the sensing layer SL may include a sensing region SA for sensing a touch of a user and a sensing peripheral region SPA located at the periphery of the sensing region SA. The sensing region SA may overlap with the display region DA of the display unit DU, and the sensing peripheral region SPA may overlap with the non-display region NDA of the display unit DU.

The sensing layer SL may be implemented as any one of a capacitive type sensing layer, an electro-magnetic type sensing layer, and an optical type sensing layer. When the sensing layer SL is implemented as the capacitive type sensing layer, a sensing electrode of the sensing layer SL may be configured as a self-capacitive type sensing electrode, a mutual-capacitive type sensing electrode, or the like.

Although a case where sensing electrodes TE and RE of the sensing layer SL include first and second sensing electrodes TE and RE, and the sensing layer SL is driven by using a two-layer mutual-capacitive method of sensing variations of mutual capacitances through the second sensing electrode RE after a driving signal is applied to the first sensing electrode TE is mainly illustrated in FIG. 10, embodiments according to the present disclosure are not limited thereto. For example, the sensing layer SL may include the first sensing electrode TE and the second sensing electrode RE without any connection electrode BE, and be driven by using a one-layer mutual-capacitive method. Alternatively, the sensing layer SL may be driven by using a one-layer self-capacitive method of sensing a variation of self-capacitances, using a kind of sensing electrode.

The first sensing electrodes TE may be arranged along the second direction DR2, and be electrically connected to each other. The second sensing electrodes RE may be arranged along the first direction DR1 intersecting the second direction DR2, and be electrically connected to each other. The first and second sensing electrodes TE and RE are electrically separated from each other. The first and second sensing electrodes TE and RE may be arranged to be spaced apart from each other.

Referring to FIG. 11, first sensing electrodes TE adjacent to each other in the second direction DR2 may be electrically connected to each other by connection electrodes BE, and first sensing electrodes TE adjacent to each other in the first direction DR1 may be insulated from each other. In addition, second sensing electrodes RE adjacent to each other in the first direction DR1 may be electrically connected to each other, and second sensing electrodes RE adjacent to each other in the second direction DR2 may be electrically insulated from each other. Therefore, a mutual capacitance may be formed at intersection points of the first sensing electrodes TE and the second sensing electrodes RE. The sensing driver 330 may determine whether a touch of a user has been input, by sensing a voltage charged in the mutual capacitance. The first sensing electrode TE and the second sensing electrode RE may be formed in a mesh shape or a net shape.

Each of the connection electrodes BE may be connected to first sensing electrodes TE adjacent to each other in the second direction DR2 through a first contact hole CNT1 and a second contact hole CNT2. One end of the connection electrode BE may be connected to one of the first sensing electrodes TE adjacent to each other in the second direction DR2 through the first contact hole CNT1. The other end of the connection electrode BE may be connected to the other of the first sensing electrodes TE adjacent to each other in the second direction DR2 through the second contact hole CNT2. Although a structure in which the first sensing electrodes TE are connected by a pair of connection electrodes BE is illustrated as an example in FIG. 11, embodiments according to the present disclosure are not limited thereto. For example, the connection electrode BE may include a plurality of sub-connection electrodes configured in several pairs.

Referring back to FIG. 10, sensing lines TL1, TL2, and RL and sensing pads TP1 and TP2 may be located in the sensing peripheral region SPA.

The sensing pads TP1 and TP2 may be located at one side of the display device 10. The sensing pads TP1 and TP2 may include a first sensing pad TP1 and a second sensing pad TP2. The first sensing pad TP1 may be located at one side of the display pad DP, and the second sensing pad TP2 may be located at the other side of the display pad DP. However, embodiments according to the present disclosure are not limited thereto.

The sensing lines TL1, TL2, and RL may include a driving line TL1 and TL2 connected to the first sensing electrode TE and a sensing line RL connected to the second sensing electrode RE.

The driving lines TL1 and TL2 may include a first driving line TL1 connected to first sensing electrodes TE located at one side of the sensing region SA and a second driving line TL2 connected to first sensing electrodes TE located at the other side of the sensing region SA. The one side of the sensing region SA may mean a lower side of the sensing region SA, and the other side of the sensing region SA may mean an upper side of the sensing region SA. The one side and the other side of the sensing region SA may be sides facing each other. For example, as shown in FIG. 10, a first sensing electrode TE located at a lower end among the first sensing electrodes TE electrically connected to each other in the second direction DR2 may be connected to the first driving line TL1, and a first sensing electrode TE located at an upper end among the first sensing electrodes TE electrically connected to each other in the second direction DR2 may be connected to the second driving line TL2.

The second driving lines TL2 may be connected to the first sensing electrodes TE at the upper side of the sensing region SA via the left outside of the sensing region SA. One ends of the driving lines TL1 and TL2 may be connected to the first sensing electrodes TE, and the other ends of the driving lines TL1 and TL2 may be connected to the first sensing pads TP1. Accordingly, the sensing driver 330 can be electrically connected to the first sensing electrodes TE.

Second sensing electrodes RE located at one side of the sensing region SA may be connected to the sensing lines RL. For example, as shown in FIG. 10, a second sensing electrode RE located at a right end among the second sensing electrodes RE electrically connected to each other in the first direction DR1 may be connected to the sensing line RL. One ends of the sensing lines RL may be connected to the second sensing electrodes RE, and the other ends of the sensing lines RL may be connected to the second sensing pads TP2. Accordingly, the sensing driver 330 can be electrically connected to the second sensing electrodes RE.

According to some example embodiments, a ground line may be further located at the outside of the sensing lines TL1, TL2, and RL.

The ground line may be located at an outermost portion of the sensing layer SL. A ground voltage may be applied to the ground line. Accordingly, when static electricity is applied from the outside, the static electricity can be discharged to the ground line. One end of the ground line may be electrically connected to the sensing pads TP1 and TP2.

In addition, a guard line may be further located between the sensing lines TL1, TL2, and RL and the ground line. Accordingly, the guard line can function to minimize coupling between the sensing lines TL1, TL2, and RL or to minimize coupling between the sensing lines TL1, TL2, and RL and the ground line. One end of the guard line may be electrically connected to the sensing pads TP1 and TP2.

Referring to FIG. 12, the sensing layer SL may include a first sensing insulating line SIL1, a sensing contact layer SCNT, a sensing protective layer SPVX, a first sensing conductive layer, and a second sensing conductive layer. Each of the above-described layers may be provided as a single layer, but be provided as a stacked layer including a plurality of layers. Another layer may be further located between the layers.

The first sensing insulating layer SIL1 may include an inorganic layer. However, embodiments according to the present disclosure are not limited thereto, and the first sensing insulating layer SIL1 may be provided as an organic layer, or have a structure in which an inorganic layer and an organic layer are alternately stacked.

The inorganic layer may include, for example, at least one of aluminum oxide, titanium oxide, silicon oxide, silicon oxynitride, zirconium oxide, and hafnium oxide.

The organic layer may include, for example, at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

The first sensing conductive layer may be located on the first sensing insulating layer SIL1. The first sensing conductive layer may include molybdenum, titanium, copper, aluminum, and alloys thereof.

The first sensing conductive layer may include the above-described connection electrode BE. The first sensing conductive layer forming the connection electrode BE may have a mesh shape as described above. The first sensing conductive layer may not be viewed by a user. In addition, the connection electrode BE may be arranged to overlap with a pixel defining layer which will be described later so as to prevent or reduce the opening ratio of the pixel being lowered.

The sensing contact layer SCNT may be located over the first sensing conductive layer. The sensing contact layer SCNT insulates the first sensing conductive layer and the second sensing conductive layer from each other.

The sensing contact layer SCNT may include the same material as the first sensing insulating layer SIL1, or include at least one material selected from the example materials described as the material constituting the first sensing insulating layer SIL1. For example, the sensing contact layer SCNT may include an inorganic layer, but embodiments according to the present disclosure are not limited thereto.

The second sensing conductive layer may be located on the second contact layer SCNT. The second sensing conductive layer may include the same material as the first sensing conductive layer, or include at least one material selected from the example materials described as the material constituting the first sensing conductive layer.

The second sensing conductive layer may include the first sensing electrodes TE and the second sensing electrodes RE. The first sensing electrode TE may penetrate the sensing contact layer SCNT and be electrically connected to the connection electrode BE through the contact hole CNT1 or CNT2 exposing one end of the connection electrode BE.

The second sensing conductive layer forming the first sensing electrodes TE and the second sensing electrodes RE may have a mesh shape as described above. The second sensing conductive layer may not be viewed by a user. In addition, the first sensing electrodes TE and the second sensing electrodes RE may be arranged to overlap with the pixel defining layer which will be described later so as to prevent or reduce instances of the opening ratio of the pixel being lowered.

The sensing protective layer SPVX may be arranged over the second sensing conductive layer. The sensing protective layer SPVX may include an organic layer. However, embodiments according to the present disclosure are not limited thereto, and the sensing protective layer SPVX may be provided as an inorganic layer, or have a structure in which an organic layer and an inorganic layer are alternately stacked.

The organic layer may include, for example, at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

The inorganic layer may include, for example, at least one of aluminum oxide, titanium oxide, silicon oxide, silicon oxynitride, zirconium oxide, and hafnium oxide.

Hereinafter, the first region A1 and the second region A2 will be described in more detail with reference to FIGS. 13 to 18.

Figure 13:
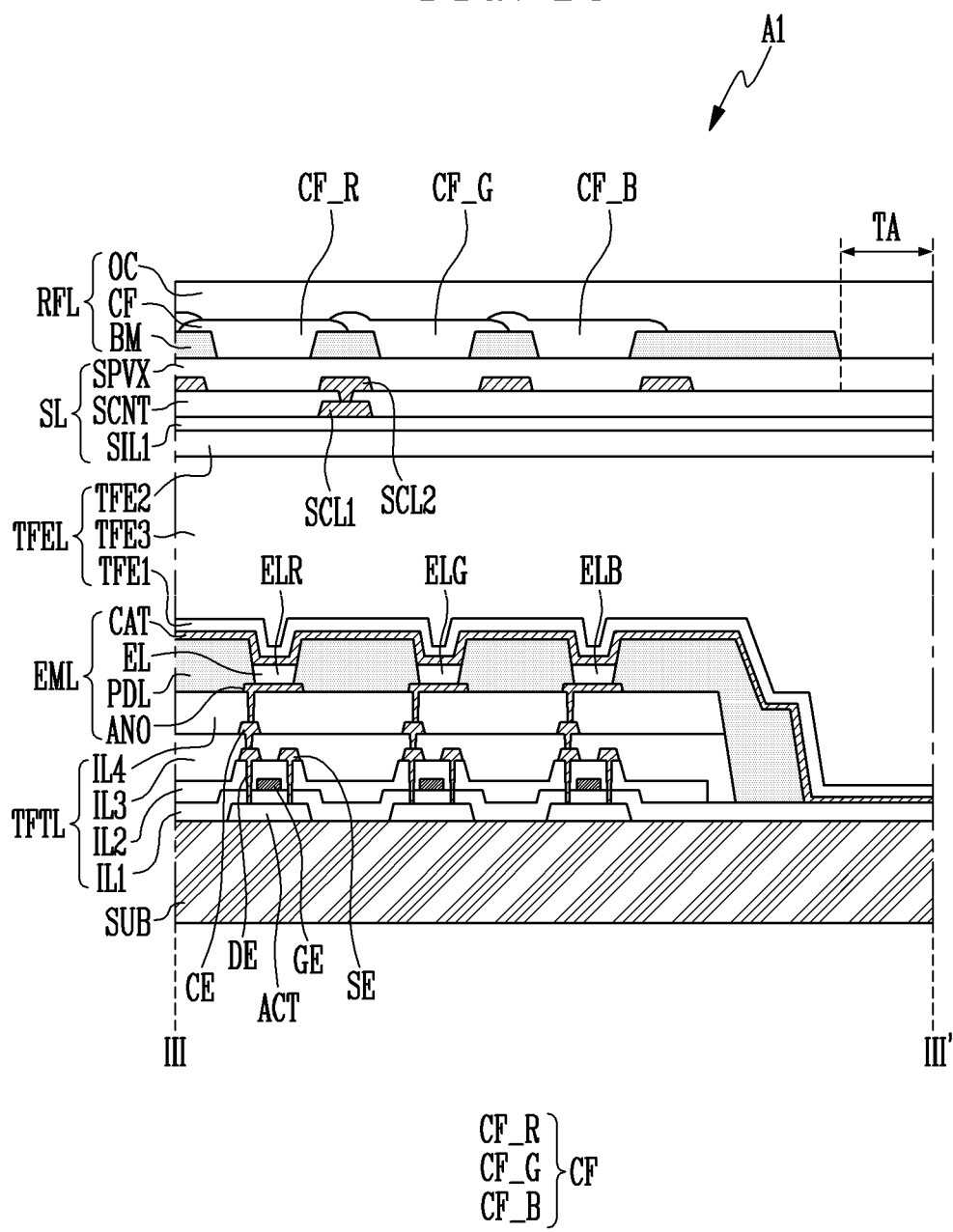
FIGS. 13 and 14 are sectional views taken along the line III-III' shown in FIG. 9.
Figure 14:
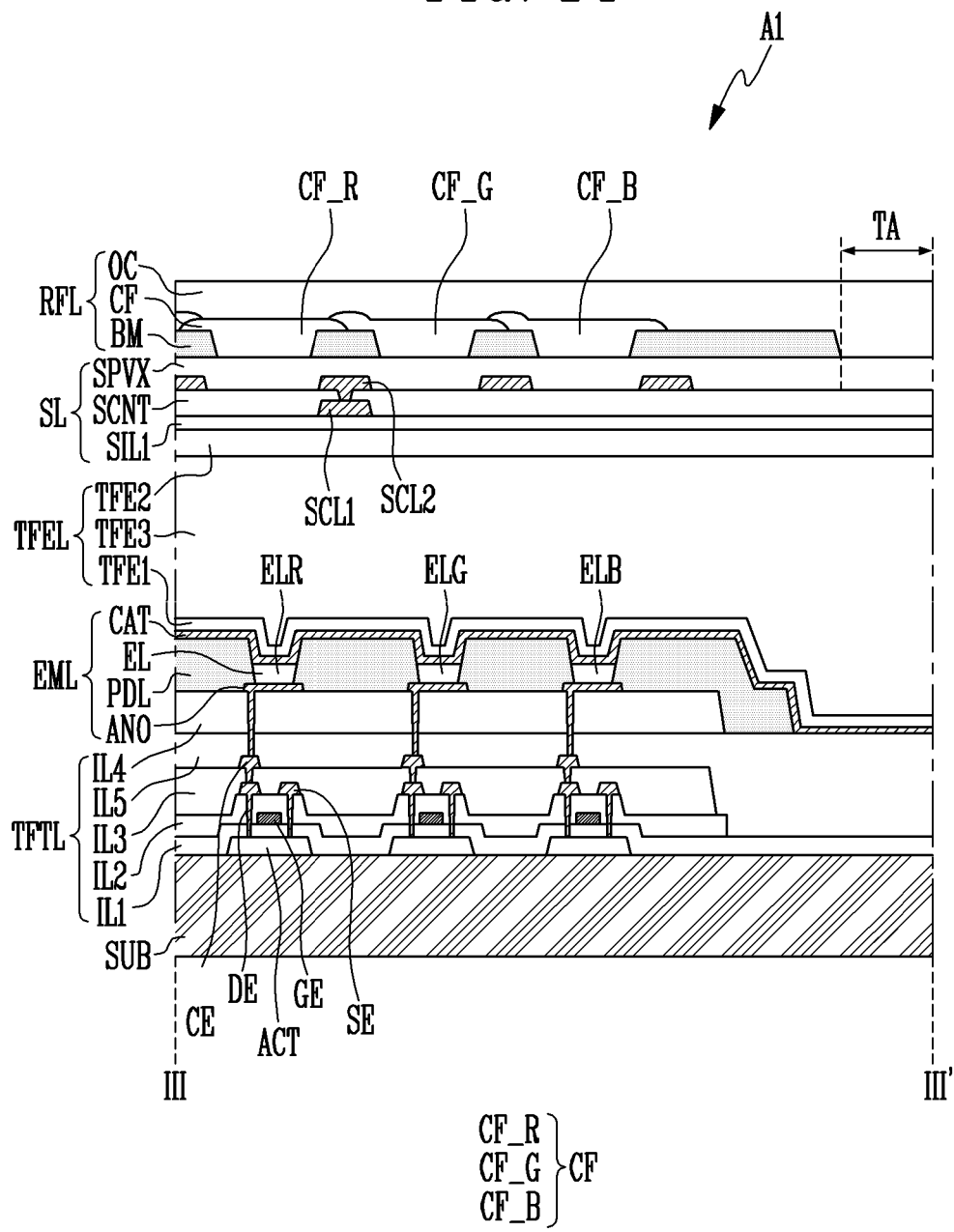

FIGS. 13 and 14 are sectional views taken along line III-III' shown in FIG. 9. FIGS. 13 and 14 may be views illustrating the pixel SP. FIGS. 13 and 14 are views illustrating the first region A1, and the views shown in FIGS. 13 and 14 may be related to the first pixel SP1.

Referring to FIG. 13, a thin film transistor layer TFTL may be located on a substrate SUB. The thin film transistor layer TFTL may include an active layer ACT, a first insulating layer IL1, a first conductive layer, a second insulating layer IL2, a second conductive layer, a third insulating layer IL3, a third conductive layer, and a fourth insulating layer IL4.

Each of the above-described layers may be provided as a single layer, but be provided as a stacked layer including a plurality of layers. Another layer may be further located between the layers.

The semiconductor layer ACT may be located on the substrate SUB. A buffer layer may be further located between the semiconductor layer ACT and the substrate SUB. The buffer layer may prevent or reduce diffusion of an impurity ion, prevent or reduce penetration of moisture, and perform a surface planarization function. The buffer layer may include silicon nitride, silicon oxide, silicon oxynitride, or the like, but embodiments according to the present disclosure are not limited thereto.

The semiconductor layer ACT forms a channel of the thin film transistors of the pixel SP. The semiconductor layer ACT may include poly-crystalline silicon. The poly-crystalline silicon may be formed by crystalizing amorphous silicon.

When the semiconductor layer ACT is made of poly-crystalline silicon, the semiconductor layer ACT doped with ions may have conductivity. Therefore, the semiconductor layer ACT may include not only a channel region of the thin film transistors but also a source region and a drain region. The source region and the drain region may be connected to both sides of each channel region.

According to some example embodiments, the semiconductor layer ACT may include single crystalline silicon, low temperature crystalline silicon, amorphous silicon, or an oxide semiconductor. The oxide semiconductor may include, for example, a two component-based compound (ABx), a three component-based compound (ABxCy), or a four component-based compound (ABxCyDz), which contains indium (In), zinc (Zn), gallium (Ga), tin (Sn), titanium (Ti), aluminum (Al), hafnium (Hf), zirconium (Zr), magnesium (Mg), etc. Also, the semiconductor layer ACT may include Indium Tin Zinc Oxide (ITZO) or Indium Gallium Zinc Oxide (IGZO).

The first insulating layer IL1 may be arranged over the semiconductor layer ACT. The first insulating layer IL1 may be arranged on the entire surface of the substrate SUB. That is, the first insulating layer IL1 throughout the first region A1 and the second region A2.

The first insulating layer IL1 may be a gate insulating layer having a gate insulating function. The first insulating layer IL1 may include a silicon compound, a metal oxide, or the like. For example, the first insulating layer IL1 may include silicon oxide, silicon nitride, silicon oxynitride, aluminum oxide, tantalum oxide, hafnium oxide, zirconium oxide, titanium oxide, or the like. The first insulating layer IL1 may be a single layer or a multi-layer configured with stacked layers of different materials.

The first conductive layer may be located on the first insulating layer IL1. The first conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu). The first conductive layer may be a single layer or a multi-layer.

The first conductive layer may include a gate electrode GE of each of the thin film transistors of the pixel SP and a first electrode of a hold-up capacitor.

The second insulating layer IL2 may be located on the first conductive layer. The second insulating layer IL2 may be located to cover the gate electrode GE of the pixel SP. The second insulating layer IL2 is not located in the transmissive part TA so as to prevent or reduce the transmittance of the transmissive part TA of the first region A1 being lowered.

The second insulating layer IL2 may function to insulate the first conductive layer and the second conductive layer from each other. The second insulating layer IL2 may include the same material as the first insulating layer IL1, or include at least one material selected from the example materials illustrated as the material constituting the first insulating layer IL1.

The second conductive layer may be located on the second insulating layer IL2. The second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu). The second conductive layer may be a single layer or a multi-layer. For example, the second conductive layer may be formed in a stacked structure of Ti/Al/Ti, Mo/Al/Mo, Mo/AlGe/Mo, Ti/Cu, etc.

The second conductive layer may include a source electrode SE and a drain electrode of each of the thin film transistors of the pixel SP. The source electrode SE and the drain electrode DE may be respectively connected to the source region and the drain region of the semiconductor layer ACT through contact holes penetrating the second insulating layer IL2 and the first insulating layer IL1.

The third insulating layer IL3 may cover the second conductive layer. The third insulating layer IL3 may be arranged to cover the source electrode SE and the drain electrode DE of the pixel SP. The third insulating layer IL3 may not be located in the transmissive part TA so as to prevent or reduce the transmittance of the transmissive part TA of the first region A1 being lowered.

The third insulating layer IL3 may be a via layer. The third insulating layer IL3 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

The third conductive layer may be located on the third insulating layer IL3. The third conductive layer may include the same material as the second conductive layer, or include at least one material selected from the example materials described as the material constituting the second conductive layer.

The third conductive layer may include a connection electrode CE of each of the thin film transistors of the pixel SP. The connection electrode CE may be in contact with the drain electrode DE through a contact hole penetrating the third insulating layer IL3.

The fourth insulating layer IL4 may cover the third conductive layer. The fourth insulating layer IL4 may be arranged to cover the connection electrode CE of the pixel SP. The fourth insulating layer IL4 may not be located in the transmissive part TA so as to prevent or reduce instances of the transmittance of the transmissive part TA of the first region A1 being lowered.

According to some example embodiments, the third conductive layer and/or the fourth insulating layer IL4 may be omitted. The third insulating layer IL3 may serve as a via layer. That is, a first electrode ANO which will be described later may be in contact with the drain electrode DE through a contact hole penetrating the third insulating layer IL3.

The fourth insulating layer IL4 may be a via layer. The fourth insulating layer IL4 may include the same material as the third insulating layer IL3, or include at least one material selected from the example materials described as the material constituting the third insulating layer IL3.

Referring to FIG. 14, according to some example embodiments, a fifth insulating layer IL5 may be further included. In this specification, the fifth insulating layer IL5 may be designated as a transmissive layer.

The fifth insulating layer IL5 may be included in the thin film transistor layer TFTL. In an example, the fifth insulating layer IL5 may be located between the third insulating layer IL3 and the fourth insulating layer IL4 in a region except the transmissive part TA of the first region A1. The fifth insulating layer IL5 may be located on the first insulating layer IL1 in the transmissive part TA of the first region A1.

The fifth insulating layer IL5 may planarize the thin film transistor layer TFTL. For example, the second insulating layer IL2 and the third insulating layer IL3 may not be located in the transmissive part TA, and therefore, a step difference may occur in the thin film transistor layer TFTL. A thickness of the fifth insulating layer IL5 in the transmissive part TA may be thicker than that of the fifth insulating layer IL5 in a region except the transmissive part TA. Accordingly, the fifth insulating layer IL5 can minimize the step difference of the thin film transistor layer TFTL.

Like the third and fourth insulating layers IL3 and IL4, the fifth insulating layer IL5 may be a via layer. The fifth insulating layer IL5 may include any one of the example materials listed with reference to the third insulating layer IL3.

Alternatively, the fifth insulating layer IL5 may include a material having excellent transmissivity such that the transmittance of the transmissive part TA of the first region A1 is improved. In an example, the fifth insulating layer IL5 may include siloxane, but embodiments according to the present disclosure are not limited thereto.

As described above, the second to fourth insulating layers IL2 to IL4 may not located in the transmissive part TA so as to improve the transmittance of the transmissive part TA, which has been described above. However, the fifth insulating layer IL5 may include a material having excellent transmissivity, and the transmissivity of the transmissive part TA may not be lowered even when a portion of the fifth insulating layer IL5 is located in the transmissive part TA. That is, the step difference of the thin film transistor layer TFTL is minimized, and simultaneously, the transmissivity of the transmissive part TA can be ensured.

A light emitting element layer EML may be located on the thin film transistor layer TFTL. The light emitting element layer EML may include the first electrode ANO, a light emitting layer EL, a second electrode CAT, and a pixel defining layer PDL.

The light emitting element layer EML is arranged throughout the pixel SP, and may not be arranged in the transmissive part TA. Accordingly, the transmissive part TA may provide a path through which light from the top of the display panel 300 can be incident into the panel lower sensors 720, 730, 740, and 750. Meanwhile, although a case where the first electrode ANO, the light emitting layer EL, and/or the pixel defining layer PDL in the light emitting element layer EML are omitted in the transmissive part TA, and the second electrode CAT is located in the transmissive part TA is illustrated in the drawings, embodiments according to the present disclosure are not necessarily limited thereto. According to some example embodiments, the first electrode ANO, the second electrode CAT, and/or the pixel defining layer PDL are omitted in the transmissive part TA, and the light emitting layer EL may be located in the transmissive part TA.

The first electrode ANO may be located on the fourth insulating layer IL4. The first electrode ANO may be electrically connected to the thin film transistor of the pixel SP. Specifically, the first electrode ANO may be in contact with the connection electrode CE through a contact hole penetrating the fourth insulating layer IL4, and be electrically connected to the drain electrode DE of the thin film transistor through the connection electrode CE. An anode electrode of the pixel SP may be provided as the first electrode ANO.

In a top-emission structure in which light is emitted toward the second electrode CAT with respect to the light emitting layer EL, the first electrode ANO may be made of a metal material having high reflexibility, such as a stacked structure of aluminum and titanium (Ti/Al/Ti), a stacked structure of aluminum and ITO (ITO/Al/ITO), an APC alloy, or a stacked structure of the APC alloy and ITO (ITO/APC/ITO). The APC alloy is an alloy of silver (Ag), palladium (Pd), and copper (Cu).

In a bottom-emission structure in which light is emitted toward the first electrode ANO with respect to the light emitting layer EL, the first electrode ANO may be made of a transparent metal material such as ITO or IZO, which enables light to be transmitted therethrough, or a translucent metal material such as magnesium (Mg), silver (Ag), or an alloy of magnesium (Mg) and silver (Ag). When the first electrode ANO is formed of the translucent metal material, light emission efficiency can be improved by a micro cavity.

The pixel defining layer PDL may define an emission region of the pixels SP. The pixel defining layer PDL may be located on the fourth insulating layer IL4 to partition the first electrode ANO. The pixel defining layer PDL may cover an edge of the first electrode ANO.

The pixel defining layer PDL may be provided as an organic layer such as acryl resin, epoxy resin, phenolic resin, polyamide resin, or polyimide resin.

Alternatively, the pixel defining layer PDL may include a light absorbing material, or have a light absorbing agent coated thereon to function to absorb light incident from the outside. In an example, the pixel defining layer PDL may include a carbon-based black pigment. However, embodiments according to the present disclosure are not limited thereto, and the pixel defining layer PDL may include an opaque metal material such as chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), which has high light absorptivity.

The pixel defining layer PDL may cover at least a portion of the thin film transistor layer TFTL. The pixel defining layer PDL may block at least a portion of light to be provided to the thin film transistor layer TFTL or the light emitting layer EL through the transmissive part TA.

When an electrode component is located in the thin film transistor layer TFTL, the pixel defining layer PDL may shield the electrode component such that the electrode component is not viewed from the outside. In particular, when the pixel defining layer PDL includes a material having excellent light absorptivity as described above, the shielding performance of an individual component located in the thin film transistor layer TFTL can be further improved.

The pixel defining layer PDL may extend in a thickness direction of the display panel. The thickness direction may mean the third direction DR3. In an example, at least a portion of the pixel defining layer PDL may cover a side surface of the second to fourth insulating layers IL2 to IL4. The second to fourth insulating layers IL2 to IL4 may not be located in the transmissive part TA as described above, and external light may be provided at one side of the thin film transistor layer TFTL. However, the pixel defining layer PDL is arranged to cover at least one side of the thin film transistor layer TFTL, so that external light which may be provided through the transmissive part TA can be blocked.

According to some example embodiments, the fifth insulating layer IL5 may be further included, to planarize the thin film transistor layer TFTL, which has been described above. A portion of the pixel defining layer PDL may be located on the fifth insulating layer IL5, and another portion of the pixel defining layer PDL may block at least a portion of external light by covering one side surface of the planarized region of the thin film transistor layer TFTL. For example, the pixel defining layer PDL may cover one side surface of the fourth insulating layer IL4 located on the fifth insulating layer IL5.

A thin film encapsulation layer TFEL may be located on the light emitting element layer EML. The thin film encapsulation layer TFEL may be located on the entire surface of the substrate SUB. The thin film encapsulation layer TFEL may be located in both the first region A1 and the second region A2.

A minimum thickness of the thin film encapsulation layer TFEL of the first region A1 may be different from that of the thin film encapsulation layer TFEL of the second region A2. The minimum thickness of the thin film encapsulation layer TFEL of each of the first region A1 and the second region A2 may be defined as a minimum length in the third direction DR3 from one surface of the thin film encapsulation layer TFEL to the other surface of the thin film encapsulation layer TFEL.

As described above, when a portion of the thin film transistor layer TFTL is omitted in the transmissive part TA, at least a portion of the thin film encapsulation layer TFEL provided in the first region A1 may be introduced into the transmissive part TA. Therefore, a thickness of the thin film encapsulation layer TFEL of the first region A1 may be formed relatively smaller than that of the thin film encapsulation layer TFEL of the second region A2.

The thin film encapsulation layer TFEL may include a first encapsulation layer TFE1, a second encapsulation layer TFE2, and a third encapsulation layer TFE3. The third encapsulation layer TFE3 may be located between the first encapsulation layer TFE1 and the second encapsulation layer TFE2. Each of the above-described layers may be provided as a single layer, but be provided as a stacked layer including a plurality of layers. Another layer may be further located between the layers.

The first encapsulation layer TFE1 may be located on the second electrode CAT. The first encapsulation layer TFE1 may be located on the entire surface of the substrate SUB. The first encapsulation layer TFE1 may be an inorganic layer. The inorganic layer may be silicon oxide (SiOx), silicon nitride (SiNx), or silicon oxynitride (SiONx), but embodiments according to the present disclosure are not limited thereto.

The second encapsulation layer TFE2 may be located on the first encapsulation layer TFE1. The second encapsulation layer TFE2 may be located on the entire surface of the substrate SUB. The second encapsulation layer TFE2 may be an inorganic layer. The second encapsulation layer TFE2 may include the same material as the first encapsulation layer TFE1, or include at least one material selected from the materials illustrated as the material constituting the first encapsulation layer TFE1.

The third encapsulation layer TFE3 may be located between the first encapsulation layer TFE1 and the second encapsulation layer TFE2. The third encapsulation layer TFE3 may function to planarize a step difference caused by the thin film transistor layer TFTL and the light emitting element layer EML.

The third encapsulation layer TFE3 may be an organic layer. The organic layer may be acryl resin, epoxy resin, phenolic resin, polyamide resin, or polyimide resin, but embodiments according to the present disclosure are not limited thereto.

A thickness of the third encapsulation layer TFE3 may be greater than that of the first encapsulation layer TFE1 and/or that of the second encapsulation layer TFE2.

In addition, a minimum thickness of the third encapsulation layer TFE3 of the first region A1 may be different from that of the third encapsulation layer TFE3 of the second region A2. The minimum thickness of the third encapsulation layer TFE3 of each of the first and second regions A1 and A2 may be defined as a minimum length in the third direction DR3 from one surface of the third encapsulation layer TFE3 to the other surface of the third encapsulation layer TFE3.

A sensing layer SL may be located on the thin film encapsulation layer TFEL. The sensing layer SL may include a first sensing insulating layer SIL1, a first sensing conductive layer SCL1, a sensing contact layer SCNT, a second sensing conductive layer SCL2, and a sensing protective layer SPVX.

The first sensing insulating layer SIL1 may be located on the second encapsulation layer TFE2. The first sensing insulating layer SIL1 may be directly located on the second encapsulation layer TFE2, to be in direct contact with one surface of the second encapsulation layer TFE2.

The first sensing insulating layer SIL1 may be arranged on the entire surface of the substrate SUB. That is, the first sensing insulating layer SIL1 may be arranged throughout the first region A1 and the second region A2.

The first sensing conductive layer SCL1 may be located on the first sensing insulating layer SIL1. The first sensing conductive layer SCL1 may include the above-described connection electrode CE, and the like.

The sensing contact layer SCNT may be arranged over the first sensing conductive layer SCL1. The sensing contact layer SCNT1 may function to insulate the first sensing conductive layer SCL1 and the second sensing conductive layer SCL2 from each other.

As described above, when the sensing contact layer SCNT includes an inorganic layer, the sensing contact layer SCNT may not be located in the transmissive part TA so as to prevent the transmittance of the transmissive part TA from being lowered. Accordingly, the sensing contact layer SCNT may not overlap with the panel lower sensors 720, 730, 740, and 750.

The second sensing conductive layer SCL2 may be located on the sensing contact layer SCNT. The second sensing conductive layer SCL2 may include the first sensing electrode TE, the second sensing electrode RE, and the like.

The second sensing conductive layer SCL2 may be electrically connected to the first sensing conductive layer SCL1 through a contact hole penetrating the sensing contact layer SCNT.

According to some example embodiments, the first sensing conductive layer SCL1 may include the first sensing electrode TE and the second sensing electrode RE. According to some example embodiments, the first sensing conductive layer SCL1 may include one of the first sensing electrode TE and the second sensing electrode RE, and the second sensing conductive layer SCL2 may include the other of the first sensing electrode TE and the second sensing electrode RE.

The sensing protective layer SPVX may be located over the second sensing conductive layer SCL2. The sensing protective layer SPVX may be located on the entire surface of the substrate SUB. That is, the sensing protective layer SPVX may be located throughout the first region A1 and the second region A2.

Hereinafter, the first sensing insulating layer SIL1, the first sensing conductive layer SCL1, the sensing contact layer SCNT, the second sensing conductive layer SCL2, and the sensing protective layer SPVX has been described in detail with reference to FIG. 12, and therefore, overlapping descriptions will be omitted.

An anti-reflective layer RFL may be located on the sensing layer SL. The anti-reflective layer RFL functions to block external light reflection, and therefore, a separate polarizing plate may be omitted. Thus, lowering of the luminance of the display device 10 can be prevented, and simultaneously, the thickness of the display panel 300 can be minimized or reduced.

The anti-reflective layer RFL may include a light blocking layer BM, a color filter CF, and an overcoat layer OC.

The light blocking layer BM may be located on the sensing protective layer SPVX. The light blocking layer BM may be arranged to overlap with the pixel defining layer PDL in a thickness direction, i.e., the third direction DR3.

The light blocking layer BM may block at least a portion of light provided thereto. The light blocking layer BM may include a light absorbing material, or have a light absorbing agent coated thereon to function to absorb light incident from the outside. The light blocking layer BM may include a carbon-based black pigment. However, embodiments according to the present disclosure are not limited thereto, and the light blocking layer BM may include an opaque metal material such as chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), which has high light absorptivity.

The light blocking layer BM may define the transmissive part TA. A region in which the light blocking layer BM and the color filter CF are not located in the first region A1 may be defined as the transmissive part TA. That is, the transmissive part TA may include a region in which the light blocking layer BM is not located while belonging to the first region A1. In an example, the range of the transmissive part TA may be changed by increasing or decreasing the size of a portion of the light bock layer BM.

The color filter CF may be located on the light blocking layer BM. One surface of the sensing protective layer SPVX, which is exposed by the light blocking layer BM, may be defined as an opening. The color filter CF may be located in the opening defined by the light blocking layer BM. The color filter CF may be in direct contact with the sensing protective layer SPVX in the opening. Also, the color filter CF may extend from an edge of the opening to a top surface of the light blocking layer BM, to be in direct contact with the top surface of the light blocking layer BM.

The color filter CF may include a red color filter CF_R overlapping with the emission region of the first sub-pixel R of the pixel SP, a green color filter CF_G overlapping with the emission region of the second sub-pixel G of the pixel SP, and a blue color filter CF_B overlapping with the emission region of the third sub-pixel B of the pixel SP.

The overcoat layer OC may be located at an outer portion of the anti-reflective layer RFL, to planarize the anti-reflective layer RFL. The overcoat layer OC may reduce influence on the color filter CF from external influence. A thickness of the overcoat layer OC located in a region except the transmissive part TA of the first region A1 may be thinner than that of the overcoat layer OC located in the transmissive part TA of the first region A1.

The overcoat layer OC may include the same material as the sensing protective layer SPVX, or include at least one material selected from the example materials described as the material constituting the sensing protective layer SPVX. The overcoat layer OC may include an organic layer, but embodiments according to the present disclosure are not limited thereto.

Hereinafter, the second region A2 will be described in detail with reference to FIGS. 15 and 16. Components identical to those described above are designated by like reference numerals, and overlapping descriptions will be omitted or simplified.

Figure 15:
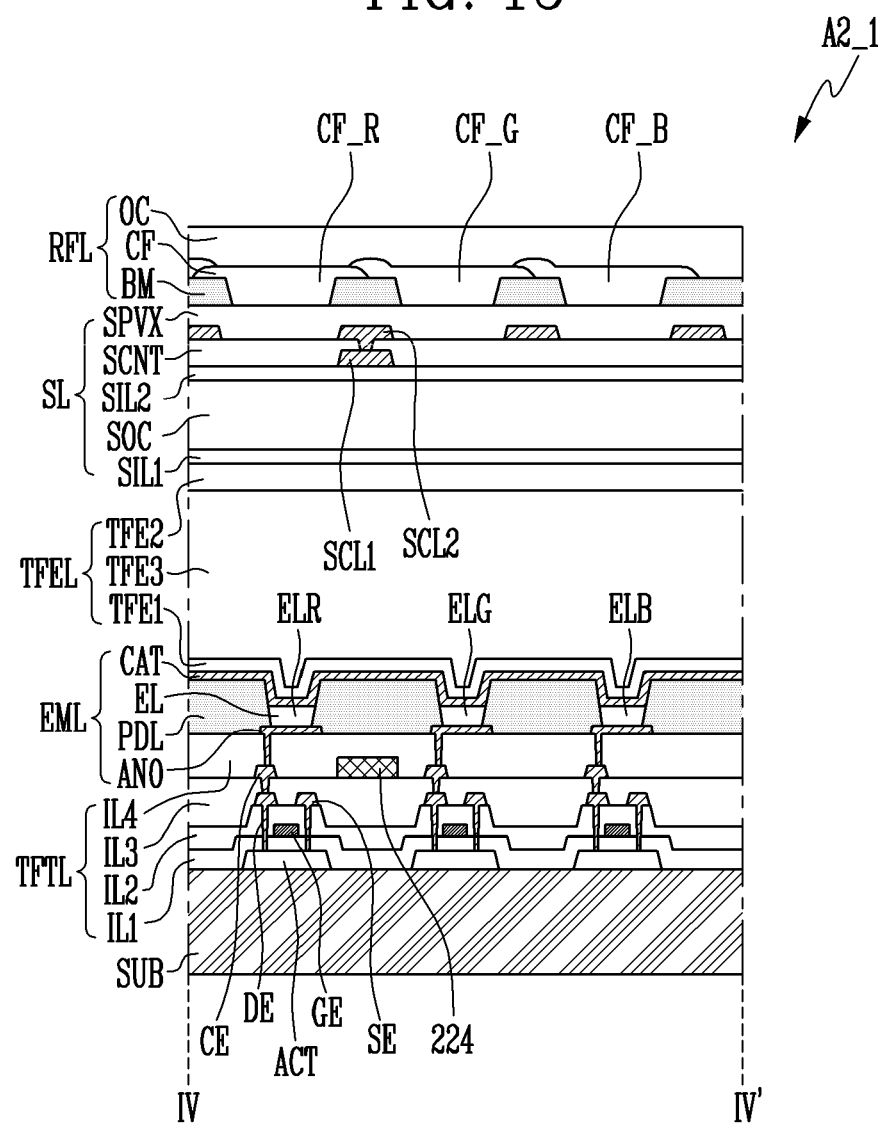
FIG. 15 is a sectional view taken along the line IV-IV' shown in FIG. 9.

FIG. 15 is a sectional view taken along line IV-IV' shown in FIG. 9. FIG. 16 is a sectional view taken along line V-V' shown in FIG. 9.

Figure 16:
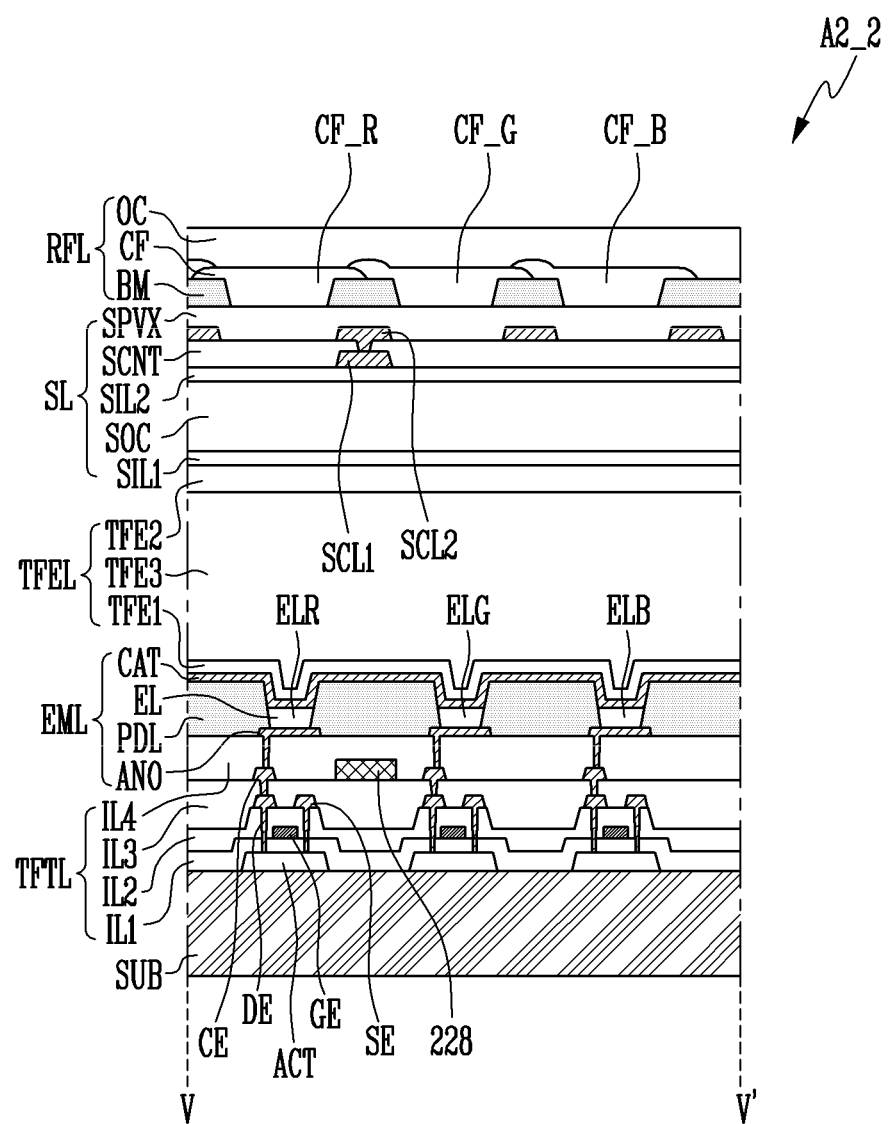
FIG. 16 is a sectional view taken along the line V-V' shown in FIG. 9.

FIGS. 15 and 16 may be views illustrating the pixel SP. FIGS. 15 and 16 are views illustrating the second region A2, and the views shown in FIGS. 15 and 16 may be related to the second pixel SP2. FIG. 15 may be a sectional view of the second pixel SP2 with respect to the (2-1)th region A2_1, and FIG. 16 may be a sectional view of the second pixel SP2 with respect to the (2-2)th region A2_2.

Figure 17:
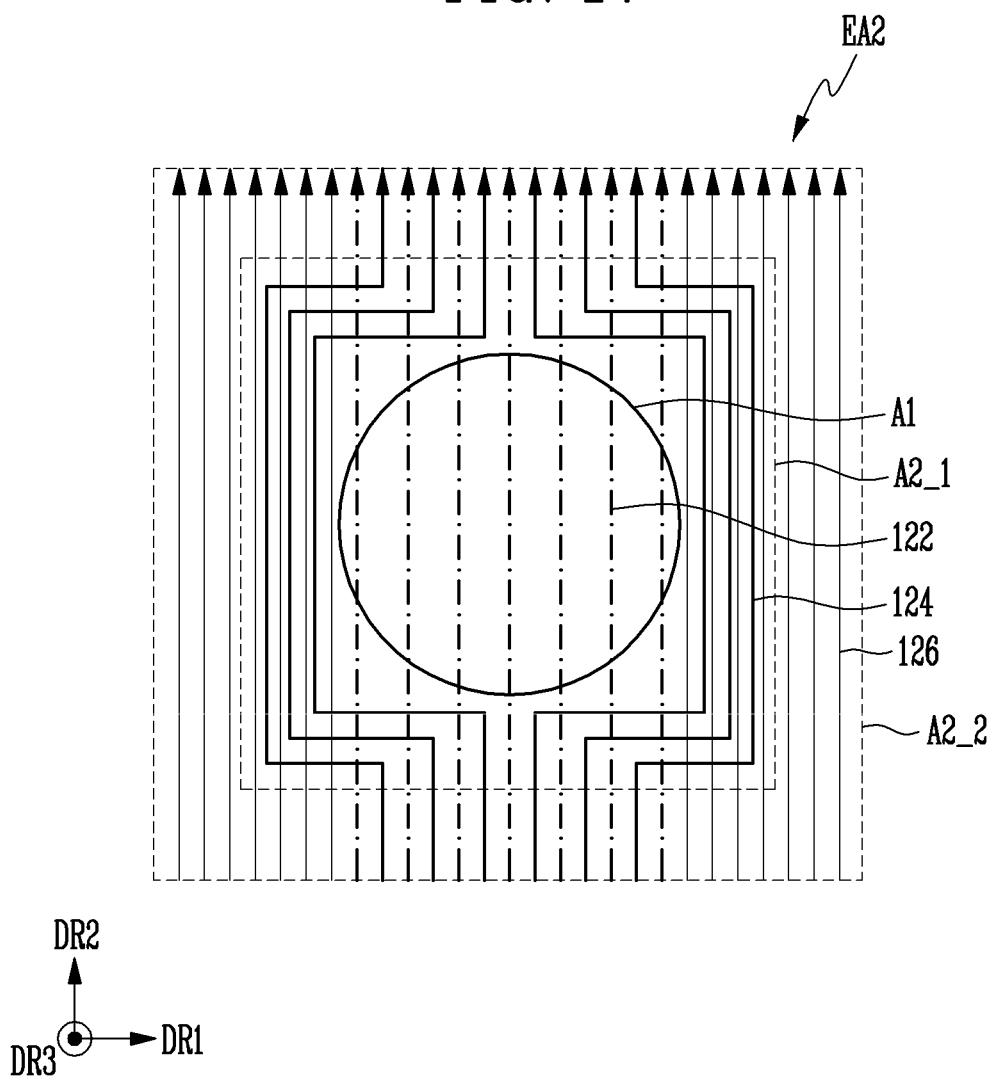
FIG. 17 is an enlarged view of region EA2 shown in FIG. 4.

Before the sectional view of the second region A2 is described, the (2-1)th region A2_1 and the (2-2)th region A2_2 will be defined with reference to FIG. 17.

The (2-1)th region A2_1 and the (2-2)th region A2_2 may be separated from each other by an arrangement structure of any one of a plurality of lines included in the display panel 300.

As described above, a plurality of lines including scan lines, data lines, and power lines, each of which are formed in a predetermined direction (e.g., the first direction DR1 or the second direction DR2) may be formed in the pixel SP within the display panel 300. Hereinafter, for convenience, the separation between the (2-1)th region A2_1 and the (2-2)th region A2_2 will be described based on the data lines formed along the second direction DR2 with respect to the pixel SP.

Referring to FIG. 17, the display device 10 may include a first data line 122, a second data line 124, and a third data line 126.

The first data line 122 may be a data line which is formed along the second direction DR2 and is electrically connected to the first pixel SP1 and the second pixel SP2. That is, the first data line 122 may pass through both the first region A1 and the second region A2.

The second data line 124 may be a data line which is formed along the second direction DR2 and is electrically connected to the second pixel SP2. The second data line 124 may not be a data line with respect to the first pixel SP1. The second data line 124 may be formed along a detour path. For example, the second data line 124 is formed along the second direction DR2, and may be bent at least once in a region adjacent to the first region A1.

The third data line 126 may be a data line which is formed along the second direction DR2 and is electrically connected to the second pixel SP2. The third data line 126 may not be a data line with respect to the first pixel SP1. The third data line 126 may not include any detour path. The path of the third data line 126 may not be bent.

The (2-1)th region A2_1 may include the detour path of the second data line 124. The (2-1)th region A2_1 may be defined as a region corresponding to the detour path of the second data line 124.

The (2-2)th region A2_2 may include a region except the (2-1)th region A2_1 in the second region A2. The (2-2)th region A2_2 may mean a portion of the second region A2 except the (2-1)th region A2_1.

Although all are not expressed in FIG. 17, a region which is not the (2-1)th region A2_1 in the second region A2 may be defined as the (2-2)th region A2_2.

Hereinafter, the necessity of a detour path with respect to the first region A1 will be described.

The second data line 124 formed in the second region A2 is to be electrically connected along a formed data line direction (the second direction DR2 with respect to FIG. 17). For example, on a plane, a second pixel located upwardly of the first region A1 in the second direction DR2 and a second pixel SP2 located downwardly of the first region A1 in the second direction DR2 are to be electrically connected to each other by the second data line 124.

Specifically, a number of first pixels SP1 included in the first region A1 may be smaller than that of second pixels SP2 included in the second region A2, and accordingly, a number of data lines formed in the first region A1 may be smaller than that of data lines formed in the second region A2. At the same time, because the transmissive part TA is provided in the first region A1, a space in which data lines can be formed may not be sufficiently secured. Therefore, because it may be difficult for a path of the second data line 124 located at a lower portion of the first region A1 to pass through the first region A1, at least a portion of the second data line 124 is to be formed by detouring the first region A1 along a region adjacent to the first region A1.

Consequently, at least a portion of the second data line 124 may be bent such that the second data line 124 is formed along a path detouring the first region A1.

The (2-1)th region A2_1 and the (2-2)th region A2_2 will be described with reference back to FIGS. 15 and 16.

Referring to FIG. 15, a detour line 224 may be formed in the (2-1)th region A2_1. The detour line 224 may be at least a portion of the second data line 124 described with reference to FIG. 17. The detour line 224 may be the second data line 124 located in the (2-1)th region A2_1. Because the detour line 224 is further included, a number of data lines in the (2-1)th region A2_1 may be greater than that of data lines in the (2-2)th region A2_2.

The detour line 224 may be formed on the fourth insulating layer IL4. However, embodiments according to the present disclosure are not limited thereto, and the detour line 224 may be provided on at least one layer among the first to fifth insulating layers IL1 to IL5.

The detour line 224 may include a conductive material. In an example, the detour line 224 may include at least one of molybdenum (Mo), tungsten (W), aluminum-neodymium (AlNd), titanium (Ti), aluminum (Al), and silver (Ag), but embodiments according to the present disclosure are not limited thereto.

The detour line 224 may be covered by the pixel defining layer PDL and/or the light blocking layer BM. The detour line 224 may be shielded by the pixel defining layer PDL and/or the light blocking layer BM not to be viewed from the outside.

Referring to FIG. 16, a dummy line 228 may be formed in the (2-2)th region A2_2. The dummy line 228 may be the same conductive layer as any one of the second data line 124 and the third data line 126. The dummy line 228 may be formed on the fourth insulating layer IL4. However, embodiments according to the present disclosure are not limited thereto, and the dummy line 228 may be provided on at least one layer among the first to fifth insulating layers IL1 to IL5.

The dummy line 228 may include a conductive material. According to some example embodiments, the dummy line 228 may include any one of the example materials listed with reference to the detour line 224, but embodiments according to the present disclosure are not limited thereto.

The dummy line 228 may be covered by the pixel defining layer PDL and/or the light blocking layer BM. The dummy line 228 may be shielded by the pixel defining layer PDL and/or the light blocking layer BM not to be viewed from the outside.

The dummy line 228 may be arranged such that an arrangement of the data lines of the (2-2)th region A2_2 becomes similar to that of the data lines in the (2-1)th region A2_1. The dummy line 228 may be further included in the (2-2)th region A2_2 so as to reduce a difference between the arrangements of the data lines of the (2-1)th region A2_1 and the (2-2)th region A2_2. Accordingly, the arrangement of lines in the (2-1)th region A2_1 can be substantially identical to that of lines in the (2-2)th region A2_2.

For example, a number of lines per unit area in the (2-1)th region A2_1 may be increased because the detour line 224 is further included in the (2-1)th region A2_1 as described above. Therefore, the number of lines per unit area in the (2-1)th region A2_1 may be different from that of lines per unit area in the (2-2)th region A2_2. Consequently, in a plan view, line arrangements (or patterns) are different from each other, and therefore, external visibility may be reduced. However, because the dummy line 228 is provided in the (2-2)th region A2_2, the line arrangement of the (2-1)th region A2_1 and the line arrangement of the (2-2)th region A2_2 correspond to each other, and thus external visibility can be improved.

Figure 18:
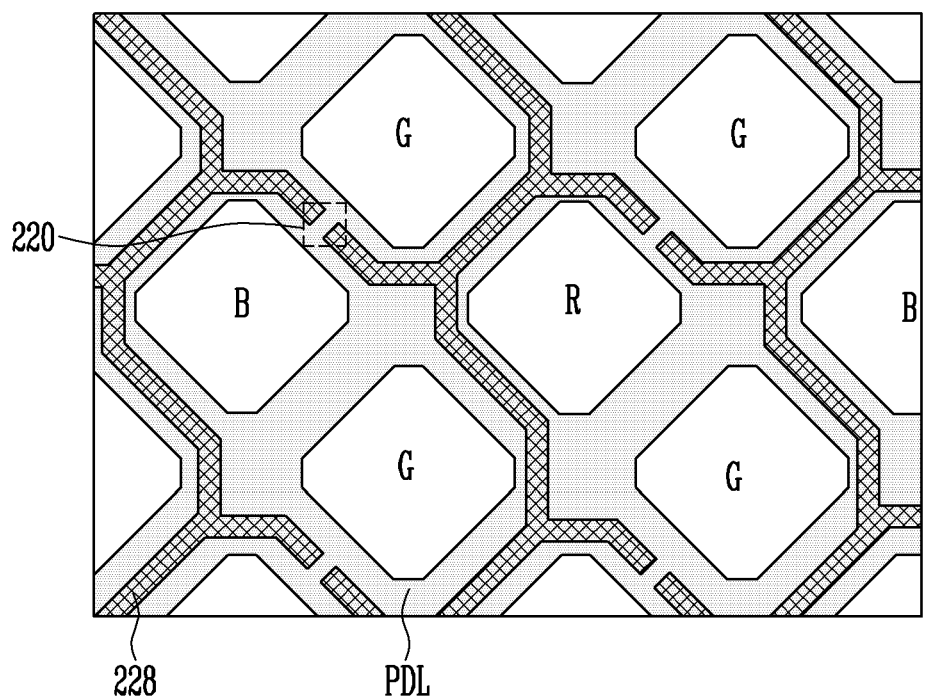
FIG. 18 is an enlarged view of region EA3 shown in FIG. 9.

FIG. 18 is an enlarged view of region EA3 shown in FIG. 9. FIG. 18 may be a view illustrating a line arrangement of the (2-2)th region A2_2.

As described above, the dummy line 228 may be further included in the (2-2)th region A2_2. The dummy line 228 may not perform any function as a line in which actual electrical information flows. Accordingly, the dummy line 228 may include a disconnection part 220 capable of blocking electrical connection.

Referring to FIG. 18, the disconnection part 220 may be located in the (2-2)th region A2_2. The disconnection part 220 may mean a region in which at least a portion of the dummy line 228 is disconnected such that the dummy line 228 is not electrically connected.

The disconnection part 220 is formed in the (2-2)th region A2_2, and may not be formed in the (2-1)th region A2_1. That is, the line arrangement of the (2-1)th region A2_1 and the line arrangement of the (2-2)th region A2_2 may be different from each other according to whether the disconnection part 220 is provided, and be viewed from the outside. However, as described with reference to FIGS. 13 and 14, a region in which lines can be located can be shielded by the pixel defining layer PDL and the light blocking layer BM. Thus, while the line arrangements of the (2-1)th region A2_1 and the (2-2)th region A2_2 are different from each other, the different line arrangements including whether the disconnection part 220 is provided are not viewed from the outside.

In accordance with the present disclosure, there can be provided a display device which can have improved external visibility, and reduce influence of external light on an internal configuration of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and their equivalents.

What is claimed is:

1. A display device comprising:
a display panel including a first region including a transmissive part configured to transmit light provided from the outside and a second region not including the transmissive part; and
a sensor overlapping with the transmissive part, and configured to obtain electrical information based on information provided from the outside,
wherein the display panel includes:
a thin film transistor layer including a plurality of transistors;
a pixel defining layer defining an emission region of a plurality of pixels; and
a light blocking layer on the pixel defining layer, and defining the transmissive part, and
wherein the pixel defining layer in the first region covers at least a portion of the thin film transistor layer such that light provided through the transmissive part is blocked.

2. The display device of claim 1, wherein at least a portion of the pixel defining layer in the first region extends in a thickness direction of the display panel.

3. The display device of claim 2, wherein the thin film transistor layer includes an insulating layer on the plurality of transistors, and
wherein the pixel defining layer in the first region covers a side surface of the insulating layer.

4. The display device of claim 3, wherein the insulating layer includes a first insulating layer and a second insulating layer,
wherein the display panel further includes a transmissive layer between the first insulating layer and the second insulating layer, and
wherein the transmissive layer overlaps with the transmissive part.

5. The display device of claim 3, wherein the insulating layer includes a first insulating layer and a second insulating layer on the first insulating layer, and
wherein, in a plan view, the first insulating layer is in the emission region and the transmissive part, and the second insulating layer is in the emission region without being in the transmissive part.

6. The display device of claim 4, wherein the transmissive layer includes siloxane.

7. The display device of claim 4, wherein the pixel defining layer in the first region overlaps with the transmissive part.

8. The display device of claim 1, wherein, in a plan view, the second region has a shape surrounding the first region.

9. The display device of claim 1, wherein the display panel includes a detour line electrically connected to a light emitting element in the second region, and the detour line includes a detour path bent at least once so as to not pass through the first region.

10. The display device of claim 9, wherein the second region includes a (2-1)th region where the detour line is arranged and a (2-2)th region where the detour line is not arranged.

11. The display device of claim 10, wherein the display panel includes a dummy line located in the (2-2)th region, the dummy line being electrically disconnected from the detour line.

12. The display device of claim 11, wherein, in a plan view, an arrangement shape of the detour line in the (2-1)th region corresponds to an arrangement shape of the dummy line in the (2-2)th region.

13. The display device of claim 11, wherein the display panel further includes a disconnection part in the (2-2)th region, and the disconnection part includes an area where a part of the dummy line is disconnected.

14. The display device of claim 13, wherein the disconnection part is under the pixel defining layer, and
wherein the pixel defining layer is configured to shield the disconnection part from light provided from the transmissive part.

15. The display device of claim 13, wherein the light blocking layer is configured to shield the disconnection part from light provided from the transmissive part.

16. The display device of claim 1, wherein the transmissive part includes an area where the light blocking layer in the first region is not located.

17. The display device of claim 1, wherein the pixel defining layer includes at least one of an opaque metal material including chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), or a carbon-based black pigment.

18. The display device of claim 1, further comprising a plurality of lines through which an electrical signal is applied to a light emitting element,
wherein the plurality of lines include a first line passing through the first region and a second line detouring the first region.

19. The display device of claim 1, wherein the sensor comprises at least one of a proximity sensor, an illuminance sensor, an iris sensor, a camera device, an infrared sensor, or an ultrasonic sensor.

20. The display device of claim 18, wherein the light emitting element comprises at least one of an organic light emitting diode, an inorganic light emitting diode, or a light emitting element made of a combination of an organic material and an inorganic material.

* * * * *